United States Patent
Xia et al.

(10) Patent No.: US 9,911,817 B2
(45) Date of Patent: Mar. 6, 2018

(54) FIELD-PLATE STRUCTURES FOR SEMICONDUCTOR DEVICES

(71) Applicant: Cambridge Electronics, Inc., Cambridge, MA (US)

(72) Inventors: Ling Xia, Belmont, MA (US); Mohamed Azize, Medford, MA (US); Bin Lu, Watertown, MA (US)

(73) Assignee: Cambridge Electronics, Inc., Cambridge, MA (US)

( * ) Notice: Subject to any disclaimer, the term of this patent is extended or adjusted under 35 U.S.C. 154(b) by 25 days.

(21) Appl. No.: 15/213,054

(22) Filed: Jul. 18, 2016

(65) Prior Publication Data
US 2017/0018617 A1    Jan. 19, 2017

Related U.S. Application Data

(60) Provisional application No. 62/193,618, filed on Jul. 17, 2015, provisional application No. 62/193,835, (Continued)

(51) Int. Cl.
*H01L 29/40* (2006.01)
*H01L 29/423* (2006.01)
(Continued)

(52) U.S. Cl.
CPC ............ *H01L 29/404* (2013.01); *H01L 28/40* (2013.01); *H01L 29/402* (2013.01);
(Continued)

(58) Field of Classification Search
CPC ... H01L 29/402; H01L 29/404; H01L 29/405; H01L 29/7786; H01L 29/861; H01L 29/94
(Continued)

(56) References Cited

U.S. PATENT DOCUMENTS 6,849,882 B2    2/2005  Chavarkar et al.
7,183,149 B2    2/2007  Ahn et al.
(Continued)

FOREIGN PATENT DOCUMENTS

WO    WO2014078699 A1    5/2014

OTHER PUBLICATIONS

Chu, Rongming, et al., "V-Gate GaN HEMTs With Engineered Buffer for Normally Off Operation," IEEE Electron Device Letters, vol. 29, No. 11, pp. 1184-1186, Nov. 2008, IEEE, US.
(Continued)

*Primary Examiner* — Marvin Payen
*Assistant Examiner* — Vernon P Webb
(74) *Attorney, Agent, or Firm* — American Patent Agency PC; Daniar Hussain; Xiaomeng Shi

(57) ABSTRACT

Field-plate structures are disclosed for electrical field management in semiconductor devices. A field-plate semiconductor structure includes a semiconductor substrate, a source ohmic contact, a drain ohmic contact, and a gate contact disposed over a gate region between the source ohmic contact and the drain ohmic contact, and a source field plate connected to the source ohmic contact. A field-plate dielectric is disposed over the semiconductor substrate. An encapsulating dielectric is disposed over the gate contact, wherein the encapsulating dielectric covers a top surface of the gate contact. The source field plate is disposed over the field-plate dielectric in a field plate region, from which the encapsulating dielectric is absent.

18 Claims, 26 Drawing Sheets

Related U.S. Application Data filed on Jul. 17, 2015, provisional application No. 62/219,954, filed on Sep. 17, 2015.

(51) Int. Cl.

| | | |
|---|---|---|
| *H01L 29/86* | (2006.01) | |
| *H01L 49/02* | (2006.01) | |
| *H01L 29/861* | (2006.01) | |
| *H01L 29/778* | (2006.01) | |
| *H01L 29/94* | (2006.01) | |
| *H01L 29/20* | (2006.01) | |
| *H01L 29/45* | (2006.01) | |
| *H01L 29/417* | (2006.01) | |
| *H01L 29/47* | (2006.01) | |

(52) U.S. Cl.
CPC ........ *H01L 29/405* (2013.01); *H01L 29/7786* (2013.01); *H01L 29/861* (2013.01); *H01L 29/94* (2013.01); *H01L 29/2003* (2013.01); *H01L 29/41766* (2013.01); *H01L 29/4236* (2013.01); *H01L 29/42316* (2013.01); *H01L 29/452* (2013.01); *H01L 29/475* (2013.01)

(58) Field of Classification Search
USPC .................................................. 257/324–330
See application file for complete search history.

(56) References Cited

U.S. PATENT DOCUMENTS

| | | | |
|---|---|---|---|
| 7,183,592 B2 | 2/2007 | Hwang | |
| 7,321,132 B2 | 1/2008 | Robinson et al. | |
| 7,449,728 B2 | 11/2008 | Wohlmuth | |
| 7,626,218 B2 | 12/2009 | Hwang et al. | |
| 8,039,301 B2 | 10/2011 | Kub et al. | |
| 8,466,555 B2 | 6/2013 | Chelakara et al. | |
| 8,686,562 B2 | 4/2014 | Jordan | |
| 8,829,613 B1 | 9/2014 | Pendharkar et al. | |
| 9,142,626 B1 | 9/2015 | Corrion et al. | |
| 2005/0051796 A1 | 3/2005 | Parikh et al. | |
| 2007/0235775 A1* | 10/2007 | Wu ...................... | H01L 29/404 257/288 |
| 2009/0146186 A1* | 6/2009 | Kub .................... | H01L 29/1602 257/194 |
| 2009/0230429 A1 | 9/2009 | Miyamoto et al. | |
| 2011/0140173 A1 | 6/2011 | Ramdani | |
| 2012/0037985 A1 | 2/2012 | Smith | |
| 2012/0049243 A1 | 3/2012 | Wu | |
| 2013/0313561 A1* | 11/2013 | Suh ...................... | H01L 29/402 257/76 |
| 2014/0097471 A1 | 4/2014 | Briere | |
| 2014/0361341 A1* | 12/2014 | Sriram .............. | H01L 29/42356 257/194 |
| 2015/0144957 A1 | 5/2015 | Lu et al. | |

OTHER PUBLICATIONS

Tang, Yong, et al. "High-Performance Monolithically-Integrated E/D mode InAlN/AlN/GaN HEMTs for Mixed-Signal Applications," Electron Devices Meeting (IEDM), 2010 IEEE International, pp. 30-34, IEEE, US.

Chiu, Hsien-Chin, et al. "Enhancement-and Depletion-Mode InGaP/InGaAs PHEMTs on 6-inch GaAs Substrate," Microwave Conference Proceedings, Asia-Pacific Microwave Conference (APMC) 2005, vol. 2, IEEE, US.

Brown, D. F., et al. "Monolithic Integration of Enhancement-and Depletion-Mode AlN/GaN/AlGaN DHFETs by Selective MBE Regrowth," IEEE Transactions on Electron Devices, vol. 58, No. 4, pp. 1063-1067, Apr. 2011, IEEE, US.

Saito, Wataru, et al. "Field-Plate Structure Dependence of Current Collapse Phenomena in High-Voltage GaN-HEMTs," IEEE Electron Device Letters, vol. 31, No. 7, pp. 659-661, Jul. 2010, IEEE, US.

Asano, T., et al. "Breakdown characteristics in AlGaN/GaN HEMTs with multi-field-plate structure," 2012 IEEE International Meeting for Future of Electron Devices, Kansai (IMFEDK), May 9-11, 2012, IEEE, Osaka, Japan. DOI: 10.1109/IMFEDK.2012.6218601.

Kai, Zhang, et al. "Field plate structural optimization for enhancing the power gain of GaN-based HEMTs," Chin. Phys. B, vol. 22, No. 9, p. 097303, 2013, Chinese Physical Society and IOP Publishing Ltd., China.

Klein, P. B., et al. "Photoionization spectroscopy of traps in GaN metal-semiconductor field-effect transistors," J. Appl. Phys., vol. 88, No. 5, pp. 2843-2852, Sep. 1, 2000, US.

Vetury, Ramakrishna, et al. "The Impact of Surface States on the DC and RF Characteristics of AlGaN/GaN HFETs," IEEE Transactions on Electron Devices, vol. 48, No. 3, pp. 560-566, Mar. 2001, IEEE, US.

Green, Bruce M., et al. "The Effect of Surface Passivation on the Microwave Characteristics of Undoped AlGaN/GaN HEMT's," IEEE Electron Device Letters, vol. 21, No. 6, pp. 268-270, Jun. 2000, IEEE, US.

Zhang, N.-Q., et al. "High Breakdown GaN HEMT with Overlapping Gate Structure," IEEE Electron Device Letters, vol. 21, No. 9, pp. 421-423, Sep. 2000, IEEE, US.

Saito, Wataru, et al. "High Breakdown Voltage AlGaN-GaN Power-HEMT Design and High Current Density Switching Behavior," IEEE Transactions on Electron Devices, vol. 50, No. 12, pp. 2528-2531, Dec. 2003, IEEE, US.

Xing, Huili, et al. "High Breakdown Voltage AlGaN—GaN HEMTs Achieved by Multiple Field Plates," IEEE Electron Device Letters, vol. 25, No. 4, pp. 161-163, Apr. 2004, IEEE, US.

Saito, Wataru, et al. "Suppression of Dynamic On-Resistance Increase and Gate Charge Measurements in High-Voltage GaN-HEMTs With Optimized Field-Plate Structure," IEEE Transactions on Electron Devices, vol. 54, No. 8, pp. 1825-1830, Aug. 2007, IEEE, US.

\* cited by examiner

FIELD-PLATE STRUCTURES FOR SEMICONDUCTOR DEVICES

REFERENCE TO RELATED APPLICATIONS

This application claims priority to U.S. Ser. No. 62/193,618, filed on 17 Jul. 2015, entitled "Metal Plate Structures for III-Nitride Transistors," U.S. Ser. No. 62/193,835, filed on 17 Jul. 2015, entitled "Novel Metal Structure for Semiconductor Device," and U.S. Ser. No. 62/219,954, filed on 17 Sep. 2015, entitled "Field-Plate Structure Having Several Electrodes," the entire disclosures of which are hereby incorporated by reference in their entireties herein.

FIELD OF THE INVENTION

Described herein are semiconductor structures having field plates for electric field management and/or gold-free contacts for manufacturability, and processes for forming said semiconductor structures. Such structures and techniques can be used to produce high performance transistors for various uses such as in power electronics, power amplification and digital electronics.

BACKGROUND OF THE INVENTION

The statements in this section may serve as a background to help understand the invention and its application and uses, but may not constitute prior art.

Compared with conventional power devices made of silicon, Group III-Nitride (III-N) semiconductors possess a number of excellent electronic properties that enable the fabrication of modern power electronic devices and structures for use in a variety of applications. Silicon's limited critical electric field and relatively high resistance make currently available commercial power devices, circuits, and systems bulky, heavy, with further constraints on operating frequencies. On the other hand, higher critical electric field and higher electron density and mobility of III-N materials allow high-current, high-voltage, high-power, and/or high-frequency performances of improved power transistors that are greatly desirable for advanced transportation systems, high-efficiency electricity generation and conversion systems, and energy delivery networks. For example, with a high breakdown voltage (e.g., >100V) due to large critical electric fields (e.g., 3 MV/cm), and a high-density (e.g., $10^{13}/cm^2$), high-mobility (e.g., >1200 $cm^2/Vs$) two-dimensional-electron-gas (2DEG) at the AlGaN/GaN heterojunction, AlGaN/GaN-based high-electron-mobility-transistors (HEMTs) have the potential to greatly reduce power loss and minimize system size of Si-based power electronics.

In spite of the enormous potential of III-N semiconductor structures for producing high-efficiency power electronic devices, device performance improvements are still limited by properties of the semiconductor material, device structures, or fabrication methods. One such limitation that poses a technical challenge for high-voltage HEMT design is electron trapping by surface or bulk trap states, leading to current collapse and an increase of dynamic on-resistance. During switching operations under a high applied voltage, trapped electrons deplete the 2DEG channel and increases the on-resistance as the applied voltage increases. Drain current levels achievable under high-stress switching are lower than those recorded during DC measurements, and such current collapse translates to lower output power and lower device performance. In addition, although surface traps may be mitigated by surface passivation such as deposition of a dielectric layer, preventing electron trapping on the surface adversely increases the off-state peak electric field at the gate edge and lowers the device breakdown voltage. Instead, field-modulating plates, or field plates, have been proposed in combination of passivation layers to manage electric field, reduce surface trapping, prevent current-collapse, and extend device breakdown voltage.

In general terms, a field plate is an electrode placed over the channel to spread out the electric field and to mitigate peaking of the electric field at the gate edge. Field plates help reduce the maximum electric field, achieve a desirable electrical field profile across the channel, and increase the breakdown voltage of a III-N transistor. The use of multiple field plates further enhances such effects. In a typical lateral field-plate structure, one or more source-connected field plates are formed over a gate contact, between the gate contact and a drain ohmic contact, with increasing field plate lengths, increasing dielectric thickness underneath each field plate, and increasing pinch-off voltage underneath each field plate. The electric field between the gate contact and the drain ohmic contact is spread out by the field plates, extending the breakdown voltage of the device.

Several issues exist for conventional field-plate structures in III-N transistors. First, while dielectric depositions over the gate can separate source field plate, gate field plate, and semiconductor materials in the transistor with appropriate distances, the conventional field-plate structure limits the ranges of separation distances as well as material choices for source and gate field plates. Second, the deposition of one field plate above another often requires the deposition of dielectric materials after gate formation, thus limiting the use of high-temperature processes. Third, the fabrication of conventional field-plate structures becomes increasingly difficult and costly as the number of field plates increases to withstand higher breakdown voltages. Each new field-plate layer on the stack adds an additional set of fabrication steps including dielectric deposition, etching, and metal deposition. Device characteristics also suffer from variations in dielectric thickness and field-plate alignment errors. Although a large number of field plates is desired to better disperse the electric field distribution, increased manufacturing variation and fabrication cost make having more than two or three field plates difficult using the conventional field-plate structure.

Furthermore, in III-N semiconductor devices including those with field-plate structures, reliable and reproducible gold-free ohmic and Schottky metal contacts with low-resistance and good edge acuity are desired. Most low-resistance ohmic contacts in III-N devices use Gold (Au) as a top layer to reduce sheet resistance underneath the ohmic contact region, and to reduce oxidation during high temperature annealing processes. Au-based Schottky contacts are also commonly used in III-N semiconductor devices for their low contact resistances. Nevertheless, the presence of Au in a silicon manufacturing facility such as a fab for large-scale CMOS processing can pose serious contamination concerns that lead to catastrophic yield problems. On the other hand, other materials compatible with CMOS processing either have higher contact resistances, or can not withstand high temperature processing as well as gold.

Therefore, in view of the aforementioned practicalities and difficulties, there is an unsolved need for new and novel field plate geometry and structure designs in semiconductor devices, including III-N semiconductor transistors, with Au-free metal contacts, for better control of device characteristics, simplification of the fabrication process, and advancements in device performance, including the continued scaling of device breakdown voltages. It is against this background that various embodiments of the present invention were developed.

BRIEF SUMMARY OF THE INVENTION

The present invention provides structures and methods for fabricating semiconductor devices with field plates and/or Au-free metal contacts.

In one aspect, one embodiment of the present invention is a semiconductor transistor device, comprising a semiconductor substrate, a source ohmic contact, a drain ohmic contact, and a gate contact disposed over a gate region positioned between the source ohmic contact and the drain ohmic contact. A field-plate dielectric comprising a first field plate region is disposed over the semiconductor substrate, and an encapsulating dielectric is disposed over the gate contact, wherein the encapsulating dielectric covers a top surface of the gate contact. The semiconductor transistor device further comprises a source field plate connected to the source ohmic contact, wherein the source field plate is disposed over the field-plate dielectric in the first field plate region, and wherein the encapsulating dielectric is absent from the first field plate region.

In some embodiments of the present invention, the semiconductor substrate comprises a material selected from the group consisting of Group IV, Group III-V, and Group II-VI semiconductor materials. In some embodiments, the semiconductor substrate comprises a Group III-Nitride (III-N) material.

In some embodiments of the present invention, the source field plate is electrically connected to the source ohmic contact. In some other embodiments of the present invention, the source field plate is capacitively coupled to the source ohmic contact.

In some embodiments of the present invention, the first field plate region has a length longer than 1 nanometer. In some embodiments, the encapsulating dielectric exceeds the gate contact by a length between 1 and 10,000 nanometers over a region between the gate contact and the drain ohmic contact.

In some embodiments of the present invention, the semiconductor transistor device further comprises a gate field plate connected to the gate contact and extending laterally from the gate contact towards the drain ohmic contact, wherein the encapsulating dielectric covers a top surface of the gate field plate, wherein the gate field plate is disposed over the field-plate dielectric in a second field plate region, and wherein the second field plate region does not overlap with the first field plate region. In some embodiments, the second field plate region has a length longer than 1 nanometer. In some embodiments, the encapsulating dielectric exceeds the gate field plate by a length between 1 and 10,000 nanometers over a region between the gate contact and the drain ohmic contact.

In some embodiments of the present invention, the field-plate dielectric comprises at least two layers. Thicknesses of different layers of the field-plate dielectric may be the same or may be different. In some embodiments, the field-plate dielectric is made from one or more materials selected from the group consisting of silicon nitride, silicon oxide, aluminum oxide, aluminum nitride, silicon oxynitride, and hafnium oxide.

In some embodiments of the present invention, the top surface of the gate contact is flush with or lower than a top surface of the field-plate dielectric. In some embodiments, the top surface of the gate field plate is also flush with or lower than a top surface of the field-plate dielectric layer. In some embodiments, the gate region includes a recess. In some embodiments, a gate dielectric is disposed below the gate contact. In some embodiments, the gate field plate is stepped.

Yet other aspects of the present invention include the semiconductor structures, processes and methods comprising the steps described herein, and also include the processes and modes of operation of the devices described herein. Other aspects and embodiments of the present invention will become apparent from the detailed description of the invention when read in conjunction with the attached drawings.

Embodiments of the various aspects of the present invention may be practiced using or in any combination with the structures and techniques discussed in U.S. patent application Ser. No. 15/094,985, entitled "Semiconductor Structure and Etch Technique for Monolithic Integration of III-N Transistors," the entire disclosure of which is hereby incorporated by reference in its entirety herein.

The foregoing summary is provided by way of illustration and is not intended to be limiting.

BRIEF DESCRIPTION OF DRAWINGS

Embodiments of the present invention described herein are exemplary, and not restrictive. Embodiments will now be described, by way of examples, with reference to the accompanying drawings. In these drawings, each identical or nearly identical component that is illustrated in various figures is represented by a like reference character. For purposes of clarity, not every component is labeled in every drawing. The drawings are not drawn to scale, with emphasis instead being placed on illustrating various aspects of the techniques and devices described herein.

DETAILED DESCRIPTION OF THE INVENTION

Figure 1:
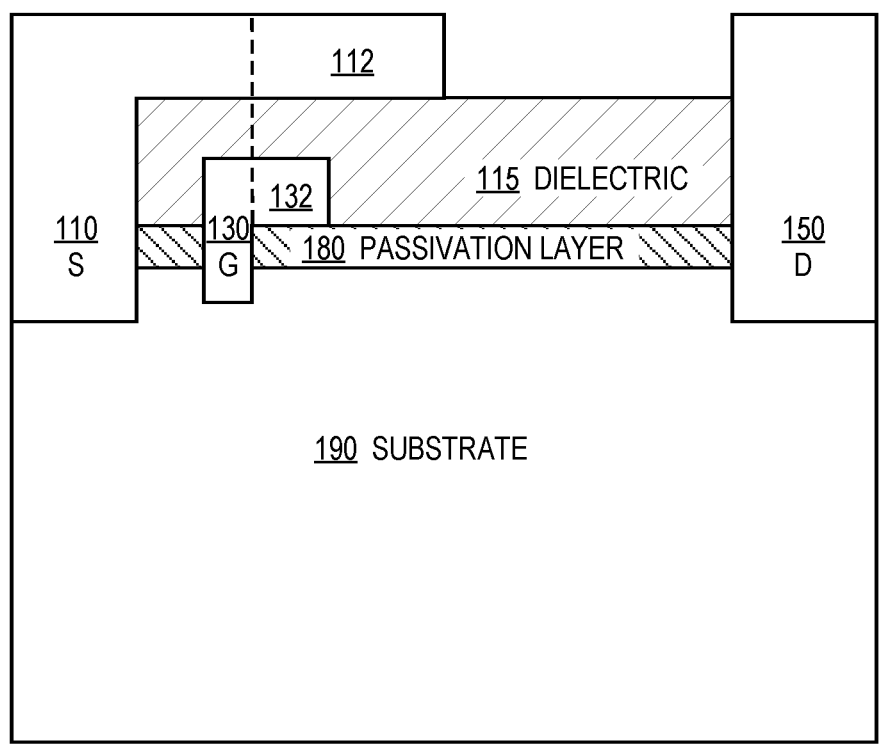
FIG. 1 shows a cross-sectional view of a transistor having a conventional field-plate structure with one source field plate and one gate field plate.

In the following description, for purposes of explanation, numerous specific details are set forth in order to provide a thorough understanding of the invention. It will be apparent, however, to one skilled in the art that the invention can be practiced without these specific details. In other instances, structures, devices, activities, and methods are shown using schematics, use cases, and/or diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Broadly, embodiments of the present invention relate to semiconductor structures having field plates for electric field management and/or gold-free contacts for manufacturability, and processes for fabricating such semiconductor structures. A significant challenge to semiconductor device design is electron trapping, which in devices such as III-N AlGaN/GaN HEMTs, can occur at different locations including metal/AlGaN interface, ungated AlGaN surface near the gate edge, AlGaN/GaN interface, and the buffer GaN layer during HEMT operation. Electron trapping causes current collapse and an increase in dynamic on-resistance, and field-plates have been proposed to suppress these phenomena. However, there are several drawbacks to existing field-plate structure designs that make the fabrication process not only time-consuming and costly, but also limited in the choices of process conditions, especially when multiple field plates are present.

Described herein are field-plate structures and optimized processes for forming such. Compared with conventional field-plate devices, embodiments of the present invention provide better device performances, higher flexibility in material and process selections, as well as significant reductions in fabrication complexity, time, cost, and process variations. The disclosed semiconductor structures are designed for performance and manufacturability, and may be formed of Group IV, Group III-V, Group II-VI semiconductor materials, including, for example, Group III-Nitride (III-N) semiconductor materials in the form of $B_wAl_xIn_yGa_zN$, in which w, x, y and z each has a suitable value between zero and one (inclusive), and $w+x+y+z=1$.

More specifically, in one aspect, a gate-encapsulation and field-plate deposition technology is described herein, allowing the use of high-temperature processes without damaging metal electrodes. For example, in a semiconductor transistor, by using a separate gate-encapsulating dielectric and a novel source field plate geometry, field-plate deposition can be completed before the formation of gate metal, enabling the use of high temperature processes without damaging the gate metal. Embodiments of the present invention also allow the source field plate dielectric and the dielectric separating the gate and the source field plate to be different. In addition, thickness of the source field plate dialectic and thickness of the dielectric separating the gate and the source field plate may be made independent from each other.

In another aspect of the present invention, further described herein are capacitively-coupled field-plate structures that allow multiple field plates to be formed on the same dielectric layer at the same time, therefore significantly simplifying the manufacturing process. Many more field plate electrodes can thus be formed than in the conventional field-plate structure without additional fabrication steps. By carefully designing the coupling capacitors, field-plate voltages may be well controlled to achieve desired electrical field profiles in the device.

Yet another aspect of the present invention relates to a novel core-shell structure for reliable and reproducible gold-free metal contacts in III-N semiconductor devices. By enclosing sequentially deposited low-resistance metals in a refractory metal shell, CMOS compatible, gold-free contacts for semiconductor devices may be manufactured.

With reference to the figures, embodiments of the present invention are now described in detail.

Gate-Encapsulated Field-Plate Structures

FIG. 1 shows a cross-sectional view of a transistor 100 having a conventional field-plate structure with one source field plate and one gate field plate. A gate 130, a source 110, and a drain 150 are etched into and deposited on passivation layer 180 and substrate 190. A source field plate 112 is connected to source 110 directly, while a gate field plate 132 is connected to gate 130 directly. Both gate and source field plates 112 and 132 help spread out electric field to increase the breakdown voltage of transistor 100. To make transistor 100, gate 130 and gate field plate 132 are first formed by etching and depositing on passivation layer 180. Dielectric 115 is then deposited over the gate 130 with gate field plate 132 to serve as a source field-plate dielectric. Source 110 with source field plate 112 is subsequently formed over the source field-plate dielectric 115.

In general terms, a field plate is an electrode placed over the channel, to spread out or disperse the electric field and to mitigate peaking of the electric field at the gate edge. Field plates help reduce the maximum electric field, achieve a desirable electrical field profile across the channel, and increase the breakdown voltage of the semiconductor device. The use of multiple field plates further enhances such effects. In the typical lateral field-plate structure 100 shown in FIG. 1, the electric field between gate 130 and drain 150 is spread out by field plates 132 and 112, thus extending the breakdown voltage of the device.

In the conventional field-plate structure illustrated by FIG. 1, dielectric 115 serves two purposes. It separates source field plate 112 from the semiconductor materials in the transistor; it also separates source field plate 112 and gate field plate 132 to avoid a short in-between. Since the effect of voltage applied through source field plate 112 depends on both the thicknesses of and the materials used for dielectric layer 115 and passivation layer 180, conventional field-plate design 100 limits the choices of separation distances and dielectric materials.

Figure 2:
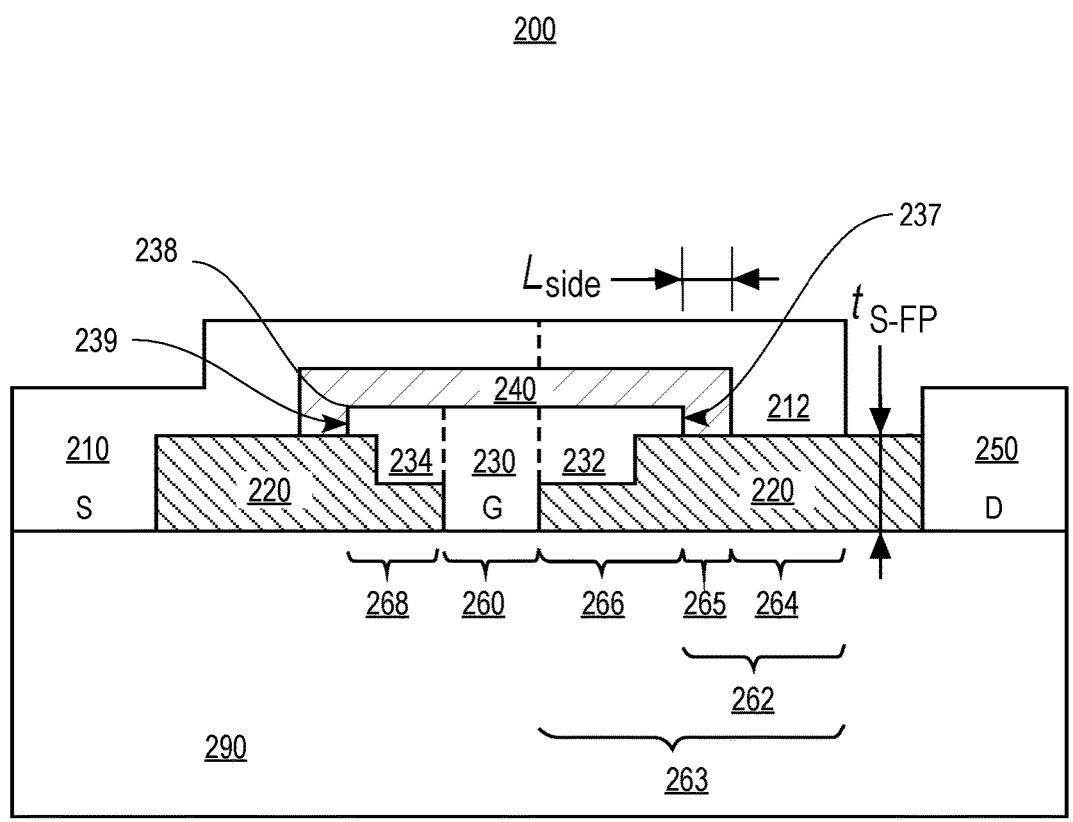
FIG. 2 shows a cross-sectional view of an exemplary gate-encapsulated transistor with field plates, according to one embodiment of the present invention.

FIG. 2 shows a cross-sectional view of an exemplary gate-encapsulated field-plate transistor 200 with a source field plate and a gate field plate, according to one embodiment of the present invention. In the present disclosure, a "field-plate transistor" refers to a transistor having one or more field plates. In this embodiment, a field-plate dielectric 220 is deposited over a substrate 290. Exemplary materials for field-plate dielectric 220 include, but are not limited to, silicon nitride ($Si_xN_y$), silicon oxide ($Si_xO_y$), aluminum oxide ($Al_2O_3$), aluminum nitride (AlN), silicon oxynitride ($SiO_xN_y$), Teflon, and hafnium oxide ($HfO_2$). Substrate 290 comprises necessary epitaxy layers to form transistors, and may include, for example, Group IV, Group III-V, Group II-VI semiconductor materials such as diamond, Si, SiC, Ge, ZnO, $ZnO_2$, $Ga_2O_3$, $In_xAl_yGa_zAs$ ($0\leq x\leq 1$, $0\leq y\leq 1$, $0\leq z\leq 1$, x+y+z=1), GaN, AlGaN, and $In_xAl_yGa_zN$ ($0\leq x\leq 1$, $0\leq y\leq 1$, $0\leq z\leq 1$, x+y+z=1). In some embodiments, substrate 290 may comprise a channel layer. In some embodiments, substrate 290 may further comprise a barrier layer formed on the channel layer, with a wider bandgap than that of the channel layer. Such a barrier layer may include one or more epitaxy sub-layers formed of the aforementioned Group IV, Group III-V, Group II-VI semiconductor materials. In some other embodiments, substrate 290 may comprise an insulator layer disposed on its upper surface. Exemplary insulator materials for this insulator layer include, but are not limited to, $Al_2O_3$, $Si_xO_y$, $Si_xN_y$, $Si_xO_yN_z$, Teflon, $HfO_2$, and any other dielectric with a dielectric constant below 200. Transistor 200 may be, for example, a metal oxide field effect transistor (MOSFET), a metal insulator field effect transistor (MISFET), a metal semiconductor field effect transistor (MESFET), or a high electron mobility transistor (HEMT).

In transistor 200 shown in FIG. 2, field-plate dielectric 220 is recessed over a gate region 260, in which a gate 230 is deposited, in between source ohmic contact 210 and drain ohmic contact 250. Metal materials used for source 210, gate 230, and drain 250 do not need to be the same, and any one or more of these contacts may employ a core-shell structure as disclosed herein later. Field-plate dielectric 220 may be further recessed to form a gate field plate 232 in gate field plate region 266, and a gate field plate 234 in gate field plate region 268. In this example, both gate field plates 232 and 234 are stepped and each contains a single step. In other embodiments, one or both gate field plates 232 and 234 may contain zero, or more than one steps, formed with appropriate recesses in field-plate dielectric 220. In some embodiments, gate field plate 234 is absent, and gate field plate 232 forms a Γ-shaped extension from gate 230 towards drain 250. A dielectric 240 is further disposed over gate contact 230 including gate field plate extensions 232 and 234, covering both top surface 238 of the gate and gate field plates, and side surfaces 237 and 239 of gate field plates 232 and 234. In other words, dielectric 240 fully covers the gate electrode, including the gate field plate extensions, on surfaces not in contact with substrate 290 or field-plate dielectric 220. Thus, dielectric 240 is considered an "encapsulating dielectric." A gate-encapsulating dielectric covers at least a top surface of an encapsulated gate. Finally, a source field plate 212 formed by extending source ohmic contact 210 laterally towards drain ohmic contact 250 is deposited over a source field plate region 263. In this disclosure, a "field plate region" refers to a continuous region covering at least a portion of a field plate, but excluding the gate. For example, a field plate region 263 comprises non-overlapping field plate regions 262 and 266, while field plate region 262 in turn comprises a field plate region 264 and another field plate region 265 with length $L_{side}$.

One advantage of the dual-field-plate structure shown in FIG. 2 is the decoupling of encapsulating dielectric 240 and field-plate dielectric 220. Because these dielectrics are formed in separate processing steps, $L_{side}$ is independent of thickness $t_{S-FP}$ of source field-plate dielectric 220, thus allowing more freedom in optimizing field-plate dielectric thicknesses for better electric field management than in the conventional design shown in FIG. 1. In addition, as field-plate dielectric 220 can be completely deposited before gate formation, high-temperature processes may be used for forming field-plate dielectric 220 while keeping the temperature of the encapsulating dielectric 240 low, and damages to the gate metal may be minimized.

Figure 3:
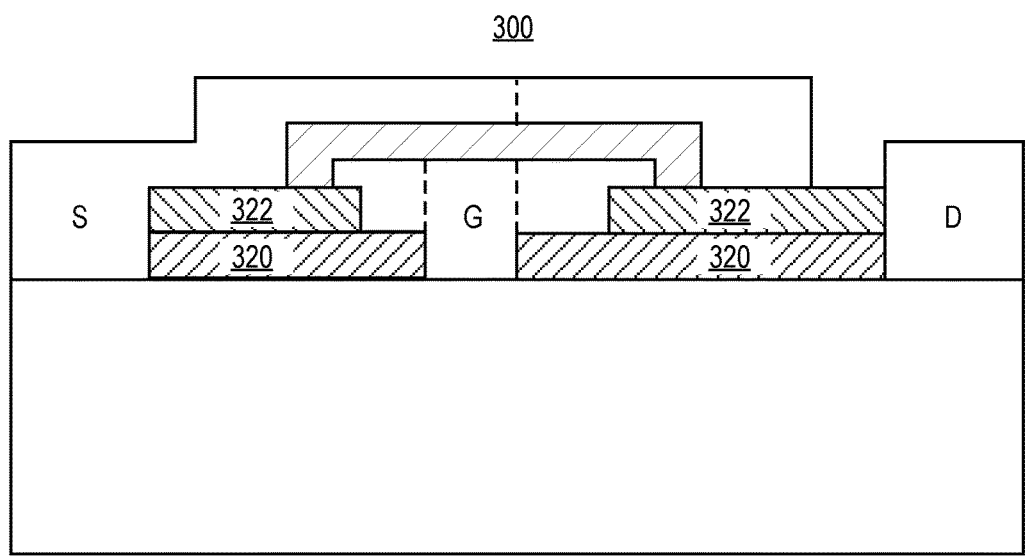
FIG. 3 shows a cross-sectional view of an exemplary gate-encapsulated transistor with field plates and two field-plate dielectric layers, according to one embodiment of the present invention.
Figure 4:
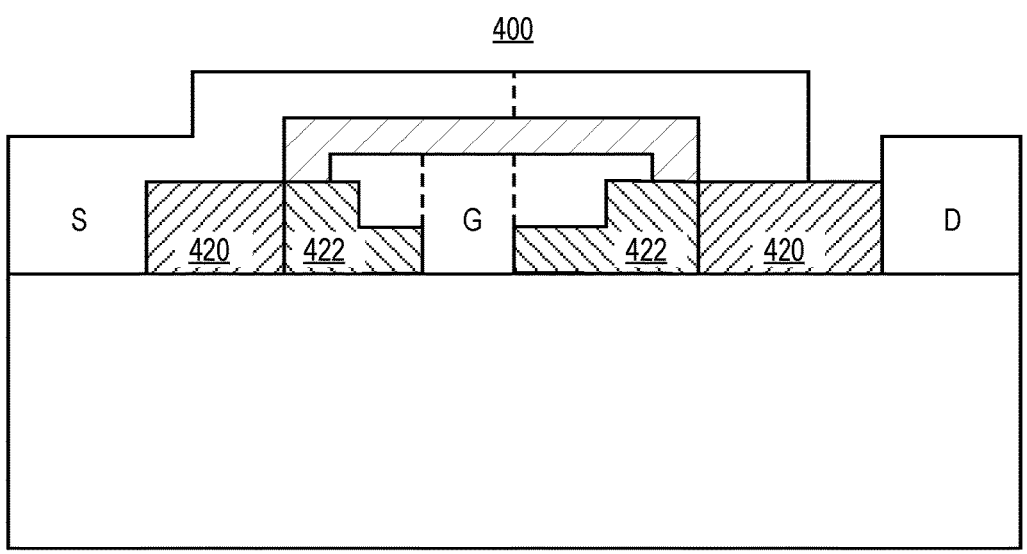
FIG. 4 shows a cross-sectional view of an exemplary gate-encapsulated transistor with field plates and two field-plate dielectric layers, according to another embodiment of the present invention.

In FIG. 2, both encapsulating dielectric 240 and source field-plate dielectric 220 are drawn as a single layer of a single dielectric material. In various embodiments of the present invention, each may comprise one or more layers of dielectric materials, wherein each layer is formed in a separate processing step, and wherein the same or different materials may be used for different layers. Thus, each of field-plate dielectric 220 and encapsulating dielectric 240 may be formed of one or more dielectric materials; field-plate dielectric 220 and encapsulating dielectric 240 may also be formed of the same or different sets of dielectric materials. For example, FIGS. 3 and 4 show cross-sectional views of exemplary gate-encapsulated dual-field-plate transistors 300 and 400 where the field-plate dielectric includes two layers. In FIG. 3, the field-plate dielectric comprises two layers 320 and 322 disposed one on top of the other. A dielectric layer is considered a field-plate dielectric layer if at least a portion of it lays underneath a field plate electrode. Different layers of the field-plate dielectric may have the same or different thicknesses, wherein a thickness may be measured as a maximum or an average vertical distance between a top surface and a bottom surface of the field-plate dielectric. In FIG. 4, the field-plate dielectric comprises two layers 420 and 422 placed side by side through appropriate deposition and etching processes. As previously disclosed, in some embodiments of the present invention, the field-plate dielectric may comprise multiple layers of the same or different dielectric materials. Similarly, the gate-encapsulating dielectric may comprise multiple layers of the same or different dielectric materials.

As exemplary embodiments of the present invention, FIGS. 5 to 10 show respective cross-sectional views of several gate-encapsulated field-plate transistors, each with a single source field plate connected to the source ohmic contact, either physically or through an electrical connection.

Figure 5:
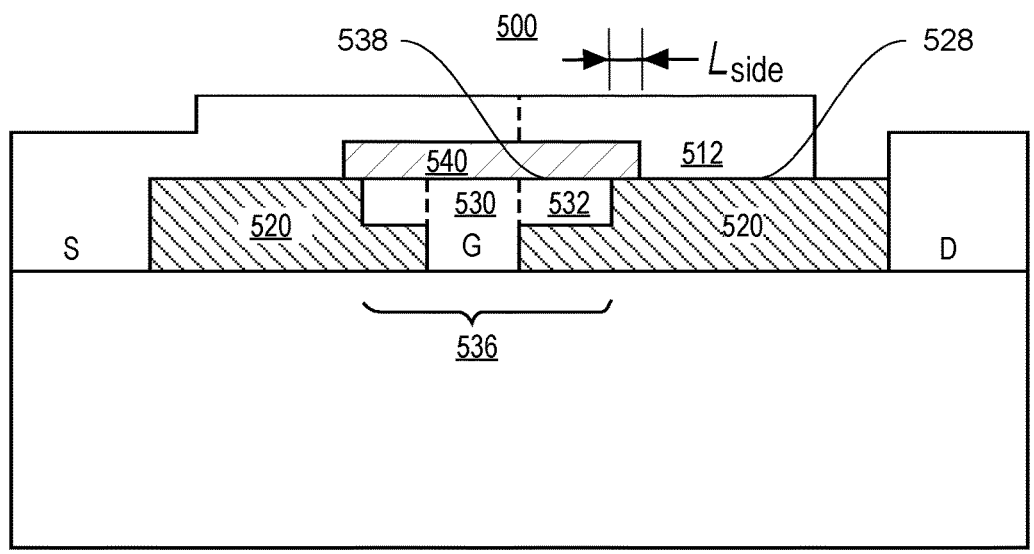
FIGS. 5, 6, 7, 8, 9, and 10 show respective cross-sectional views of exemplary gate-encapsulated transistors with field plates, according to several embodiments of the present invention.

FIG. 5 shows a cross-sectional view of an exemplary gate-encapsulated dual-field-plate transistor 500 with a planar encapsulating dielectric 540, according to one embodiment of the present invention. In this example, gate field plate 532 is not stepped, and top surface 538 of gate field plate 532 is flush with, or on the same level as top surface 528 of field-plate dielectric 520. Since gate field plate 532 is a direct flat extension from gate 530, encapsulating dielectric 540 is planar in shape. In some embodiments, gate field plate 532, with or without additional steps, may have its top surface 538 positioned above, flush with, or below top surface 528 of field-plate dielectric 520. In addition, the separation $L_{side}$ between the outer edge of gate field plate 532 and the inner edge of source field plate 512 may be set to close to zero. In some embodiments, $L_{side}$ is in the range between 1 nanometer and 5 nanometers, inclusive or exclusive; in some embodiments, $L_{side}$ is in the range between 5 nanometers and 50 nanometers, inclusive or exclusive; in some embodiments, $L_{side}$ at least 50 nanometers, inclusive or exclusive; in some embodiments, $L_{side}$ is in the range between 50 nanometers and 10,000 nanometers, inclusive or exclusive. In yet some other embodiments where top surface 538 of gate field plate 532 is below top surface 528 of field-plate dielectric 520, the separation distance $L_{side}$ may be zero, and encapsulating dielectric 540 may be stepped instead of being planar, as it fills the dielectric recess above all or a portion of region 536.

Figure 6:
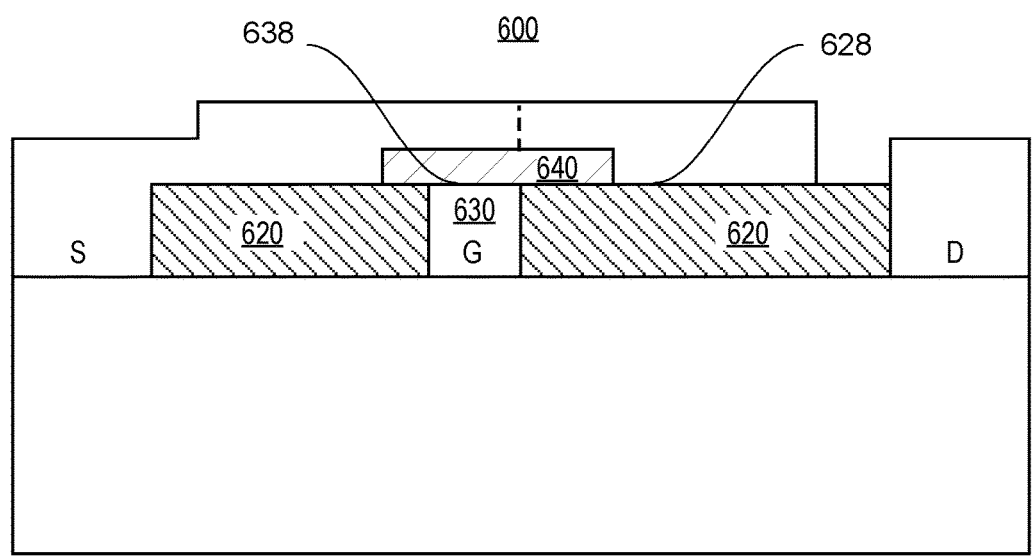

FIG. 6 shows a cross-sectional view of an exemplary gate-encapsulated single-field-plate transistor 600, according to one embodiment of the present invention. In this particular embodiment, gate 630 has a rectangular cross-section, and is covered at its top surface by gate-encapsulating dielectric 640, and at its side surfaces by field-plate dielectric 620. While the top surface 638 of gate 630 is shown to be flush with a top surface 628 of field-plate dielectric 620, in some other embodiments, top surface 638 of gate 630 may be positioned above or below top surface 628 of field-plate dielectric 620, through appropriate adjustments to gate thickness and/or field-plate dielectric thickness. In embodiments where top surface 638 of gate 630 is below top surface 628 of field-plate dielectric 620, encapsulating dielectric 640 may be stepped instead of being planar, as it fills the dielectric recess above gate 630.

Figure 7:
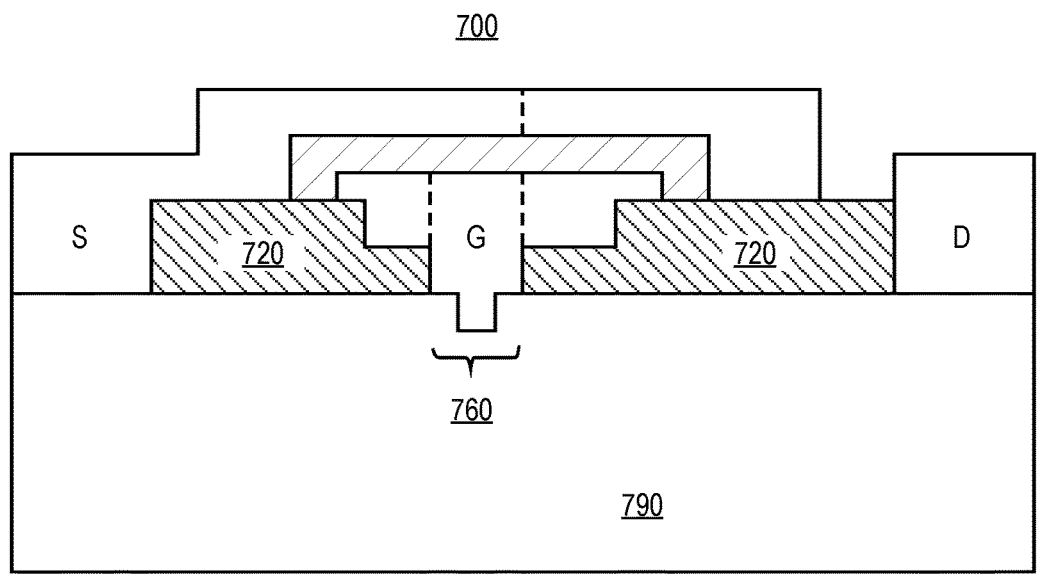
Figure 8:
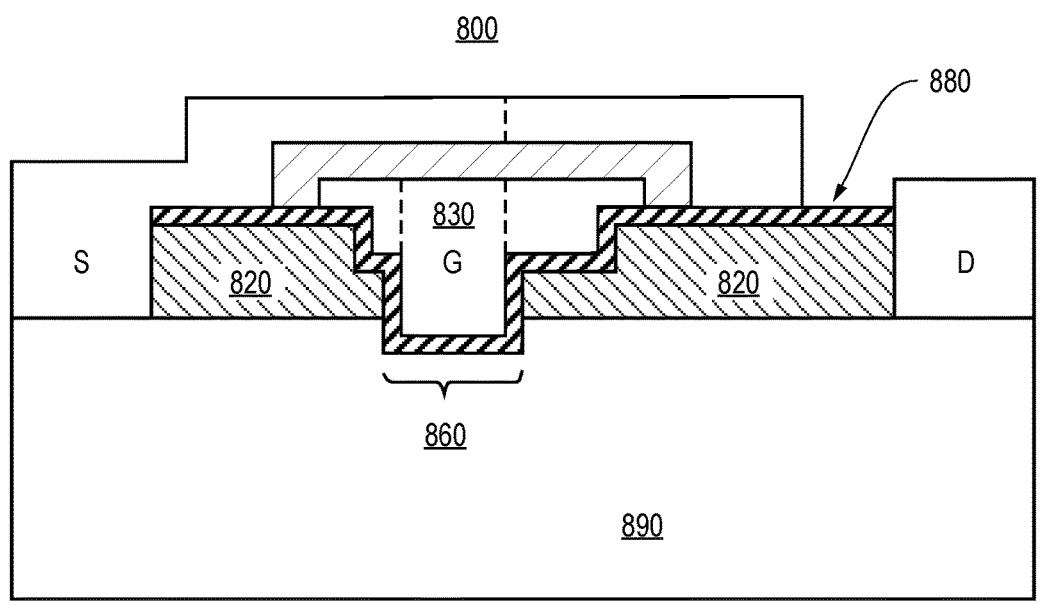

FIG. 7 shows a cross-sectional view of an exemplary gate-encapsulated dual-field-plate transistor 700 with a gate recess into the substrate, according to one embodiment of the present invention. In this particular example, the field-plate dielectric layer has been recessed across gate region 760 for gate formation, and substrate 790 is further recessed in a portion of gate region 760. By comparison, FIG. 8 shows a cross-sectional view of an exemplary gate-encapsulated dual-field-plate transistor 800 where substrate 890 is recessed across the entire gate region 860. Moreover, in FIG. 8, a gate dielectric layer 880 is deposited above field-plate dielectric 820, but below gate 830 with gate field plates. Exemplary gate dielectric materials for gate dielectric layer 880 include, but are not limited to, $Al_2O_3$, $Si_xO_y$, $Si_xN_y$, $Si_xO_yN_z$, Teflon, $HfO_2$, and any other dielectric with a dielectric constant below 200.

Figure 9:
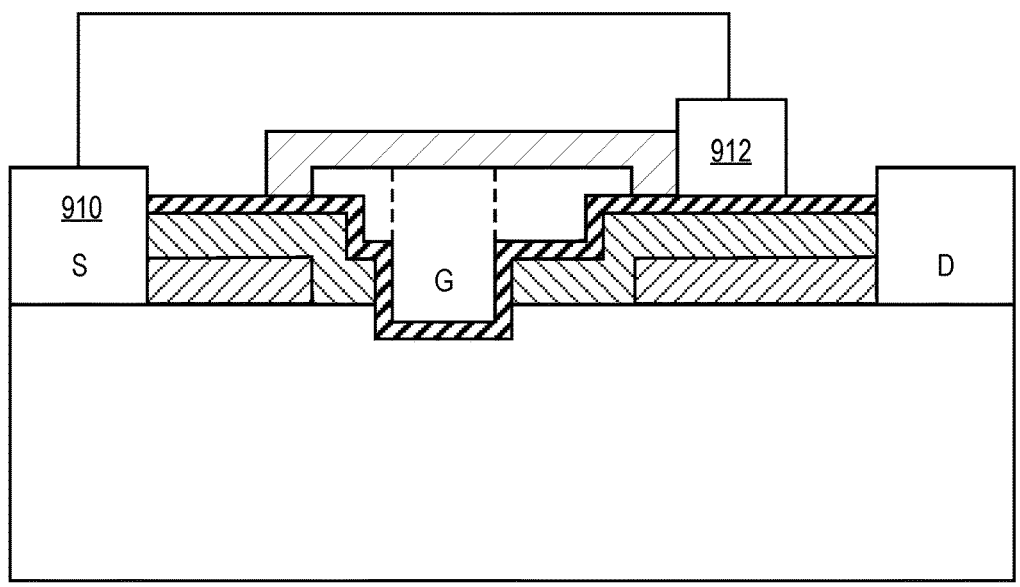
Figure 10:
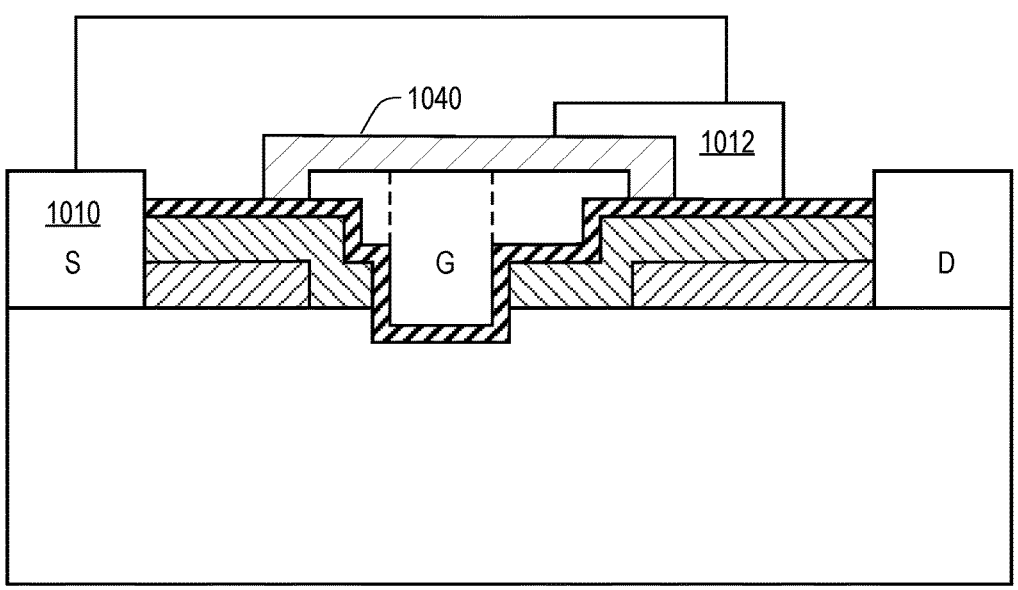

FIG. 9 shows a cross-sectional view of yet another exemplary gate-encapsulated dual-field-plate transistor 900 with a separate source field plate 912, according to one embodiment of the present invention. Unlike source field plate 212 which is directly connected to source 210 in FIG. 2, source field plate 912 in FIG. 9 is physically separate from but electrically connected to source 910. Field plate electrode 912 may be made of the same or different materials as other electrodes within the transistor, and may employ a core-shell structure as disclosed herein later. FIG. 10 shows a cross-sectional view of another exemplary gate-encapsulated dual-field-plate transistor 1000 with an electrically connected source field plate 1012 that partially covers a gate encapsulating dielectric 1040, according to yet another embodiment of the present invention.

Figure 11:
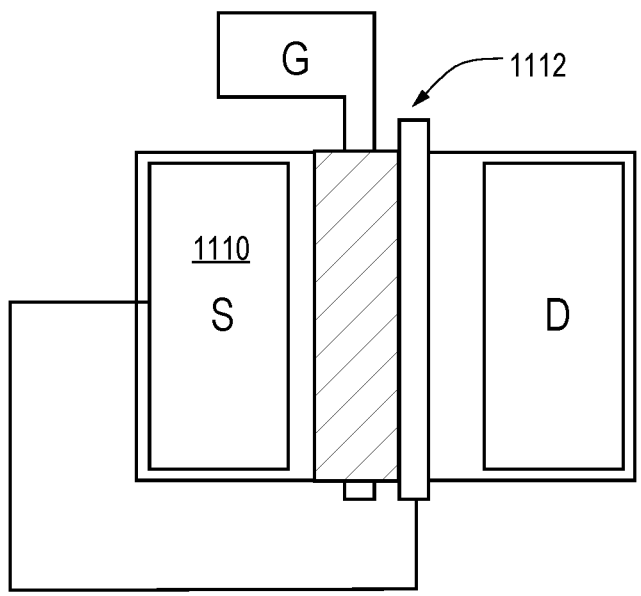
FIG. 11 shows a top view of a gate-encapsulated transistor having a separate source field plate electrically connected to a source, according to one embodiment of the present invention.
Figure 12:
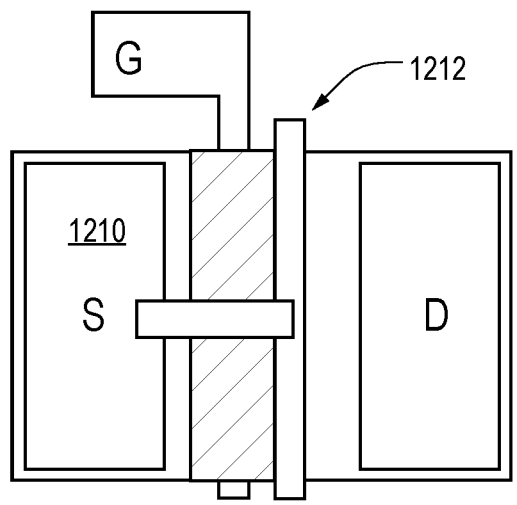
FIG. 12 shows a top view of a gate-encapsulated transistor having a bridge connection to a source field plate, according to one embodiment of the present invention.

FIG. 11 shows a top view of a gate-encapsulated field-plate transistor 1100 with a source field plate 1112 electrically connected to a source 1110. Transistor 1100 is equivalent to transistor 900 in FIG. 9. FIG. 12 shows another embodiment of the present invention through a top view of a gate-encapsulated field-plate transistor 1200 with a bridge connection from source 1210 to source field plate 1212.

Figure 13A:
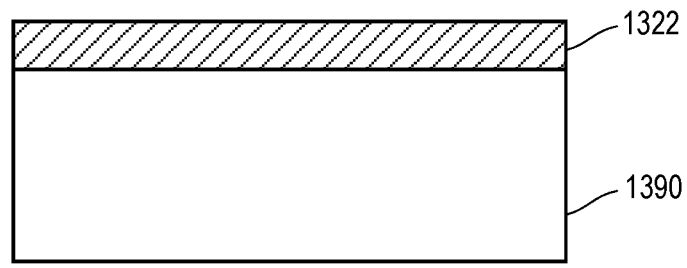
FIGS. 13A, 13B, 13C, 13D, 13E, and 13F show respective cross-sectional views of the gate-encapsulated transistor with field plates in FIG. 2, depicted in successive stages of fabrication, according to one embodiment of the present invention.
Figure 13B:
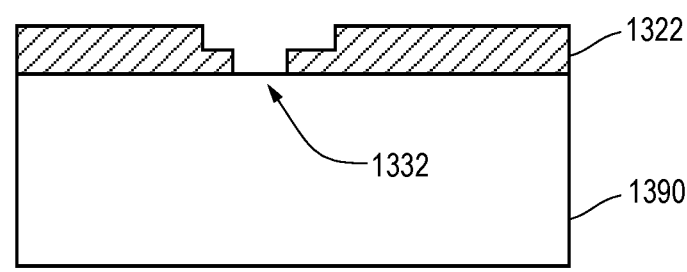
Figure 13C:
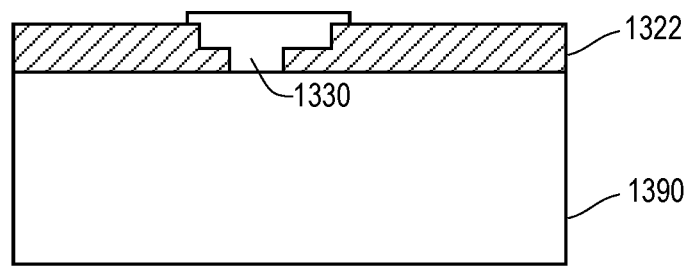
Figure 13D:
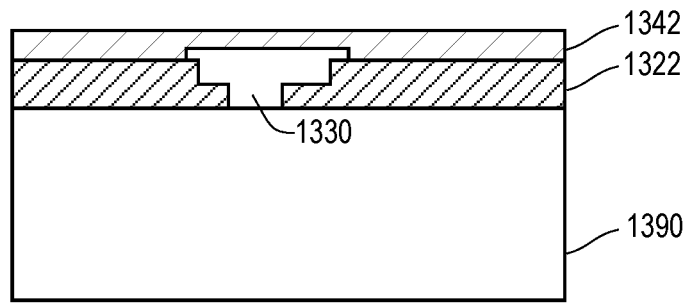
Figure 13E:
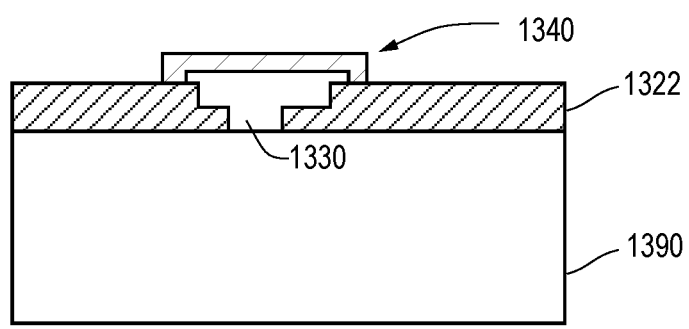
Figure 13F:
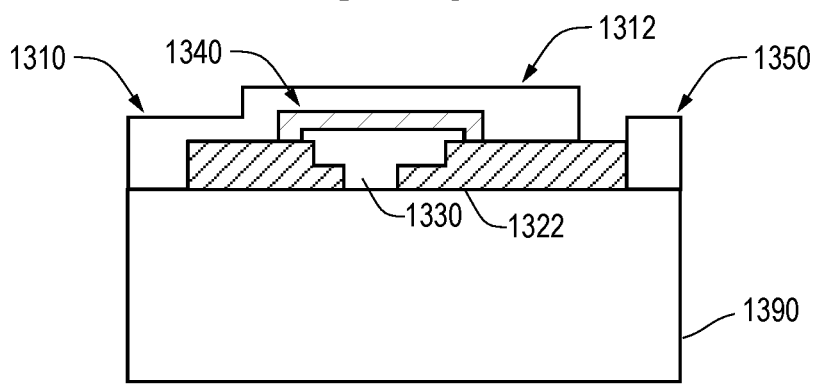

FIGS. 13A to 13F show respective cross-sectional views of gate-encapsulated field-plate transistor 200 in FIG. 2, depicted in successive stages of fabrication, according to one embodiment of the present invention. In FIG. 13A, a first field-plate dielectric layer 1322 may be deposited on a substrate 1390. In FIG. 13B, two etching steps may be performed to remove a portion of first field-plate dielectric layer 1322 to form a stepped recess or opening 1332. In FIG. 13C, a gate 1330 with stepped gate field plates may be formed of any suitable conductor or semiconductor material in opening 1332. In FIG. 13D, an encapsulating dielectric layer 1342 is deposited on top of gate 1330 and field-plate dielectric layer 1322. In FIG. 13E, an etching step may be performed to remove portions of encapsulating dielectric layer 1342 to form a gate-encapsulating dielectric 1340. Lastly, in FIG. 13F, source and drain regions may be formed, as understood by those of ordinary skill in the art, by further etching into field-plate dielectric layer 1322. Source and drain ohmic contacts 1310 and 1350, as well as source field plate 1312 may then be formed through the same metallization step. Source field plate 1312 lays above source field-plate dielectric layer 1322 and is directly connected to source ohmic contact 1310.

Figure 14A:
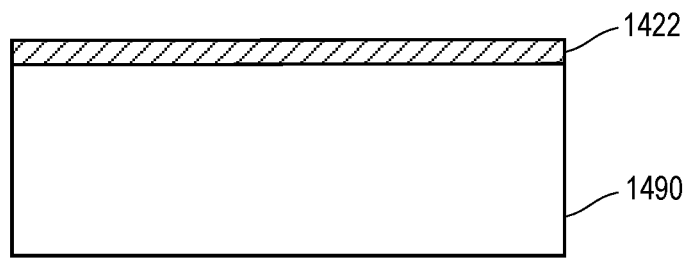
FIGS. 14A, 14B, 14C, 14D, 14E, 14F, 14G, 14H, and 14J show respective cross-sectional views of the gate-encapsulated transistor with field plates in FIG. 3, depicted in successive stages of fabrication, according to one embodiment of the present invention.
Figure 14B:
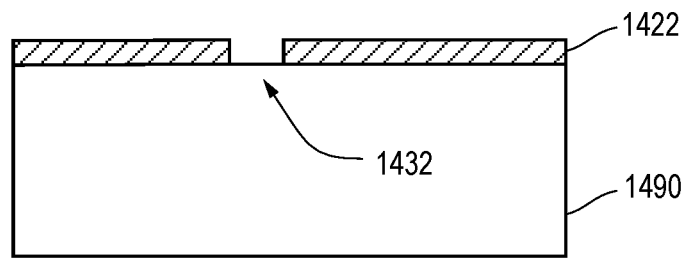
Figure 14C:
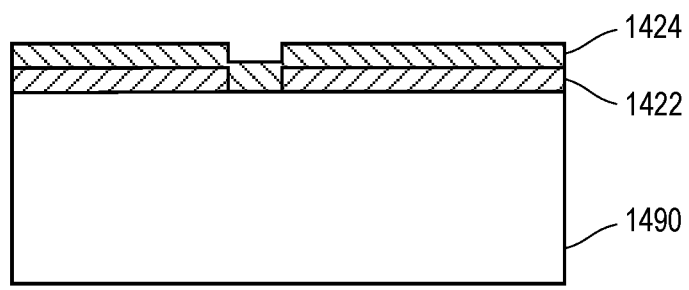
Figure 14D:
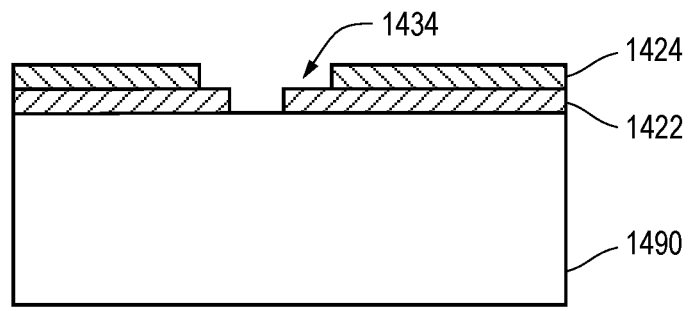
Figure 14E:
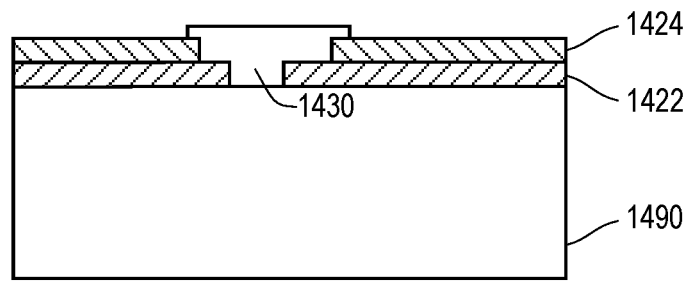
Figure 14F:
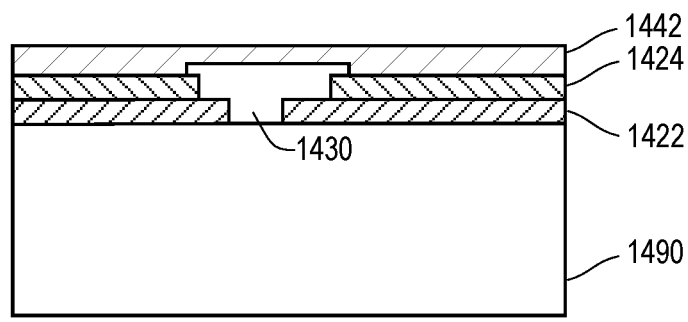
Figure 14G:
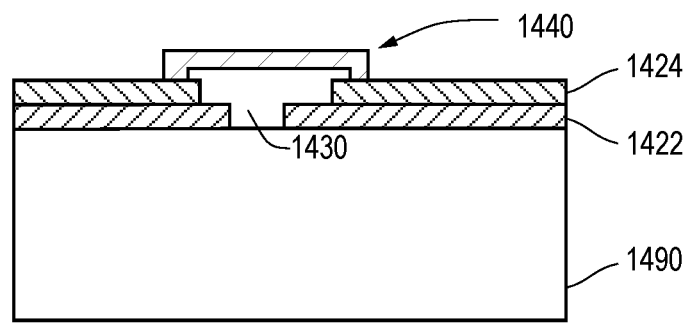
Figure 14H:
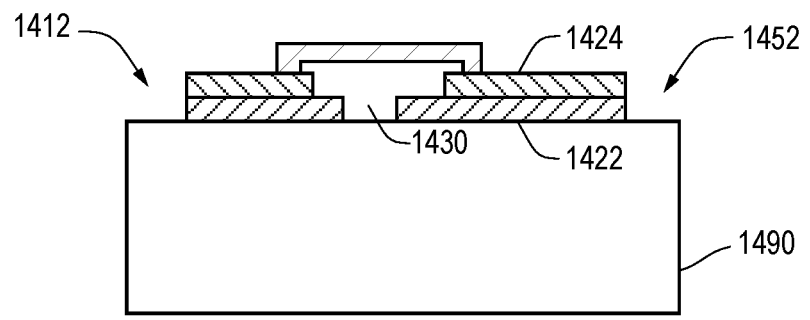
Figure 14J:
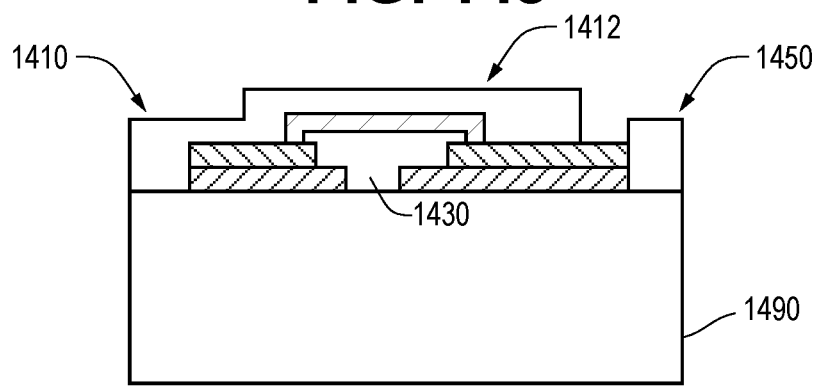

FIGS. 14A-14J show respective cross-sectional views of gate-encapsulated field-plate transistor 300 in FIG. 3, depicted in successive stages of fabrication, according to one embodiment of the present invention. In FIG. 14A, a first field-plate dielectric layer 1422 may be deposited on a substrate 1490. In FIG. 14B, an etching step may be performed using an etching technique to remove a portion of first field-plate dielectric layer 1422 to form recess or gate opening 1432. In FIG. 14C, a second field-plate dielectric layer 1424 is deposited on top of first field-plate dielectric layer 1422. As previously disclosed, the two field-plate dielectric layers may comprise the same or different dielectric materials, and any suitable dielectric material may be used for field-plate dielectric layers 1422 and 1424. In FIG. 14D, a second etching step may be performed to form a gate field plate opening 1434 in second field-plate dielectric layer 1424. In FIG. 14E, a gate 1430 with stepped gate field plates may be formed, of any suitable conductor or semiconductor. In FIG. 14F, an encapsulating dielectric layer 1442 is deposited on top of gate 1430 and field-plate dielectric layer 1424. In FIG. 14G, an etching step may be performed to remove portions of the encapsulating dielectric layer to form a gate-encapsulating dielectric 1440. In FIG. 14H, source and drain regions may be formed, as understood by those of ordinary skill in the art, by further etching into field-plate dielectric layers 1422 and 1424. Source ohmic contact 1410 with extended source field plate 1412 and drain ohmic contact 1450 may then be formed. Source field plate 1412 is directly connected to source ohmic contact 1410.

Figure 15A:
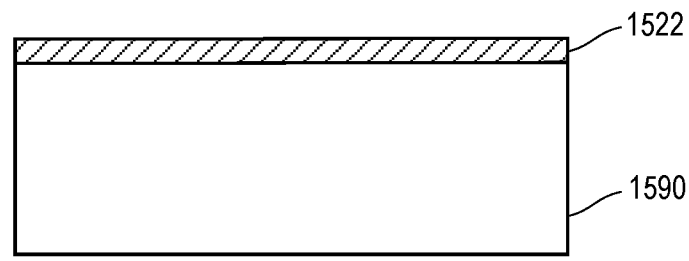
FIGS. 15A, 15B, 15C, 15D, 15E, 15F, 15G, 15H, and 15J show respective cross-sectional views of the gate-encapsulated transistor with field plates in FIG. 9, depicted in successive stages of fabrication, according to one embodiment of the present invention.
Figure 15B:
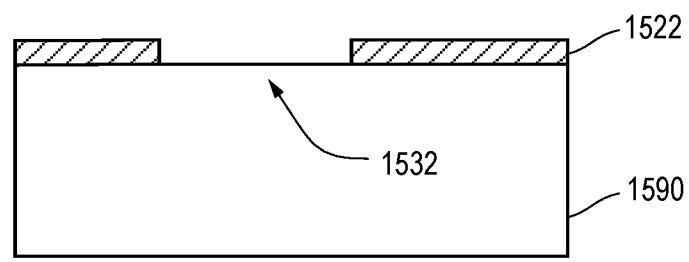
Figure 15C:
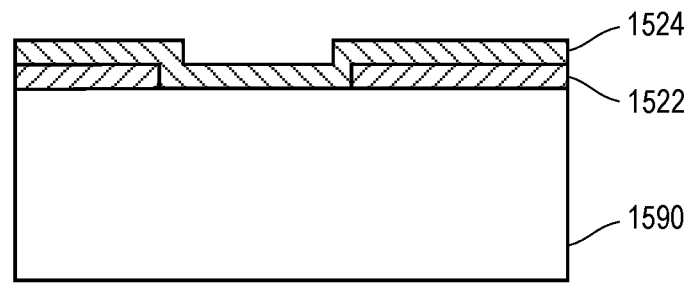
Figure 15D:
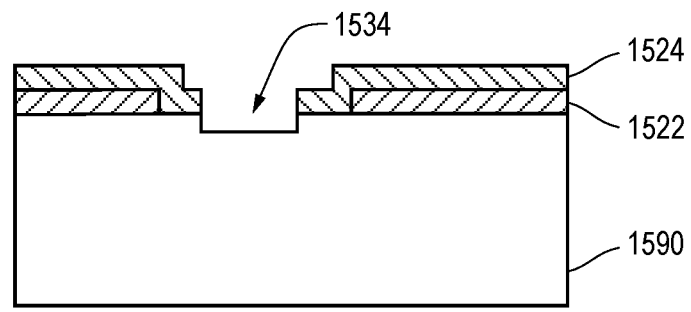
Figure 15E:
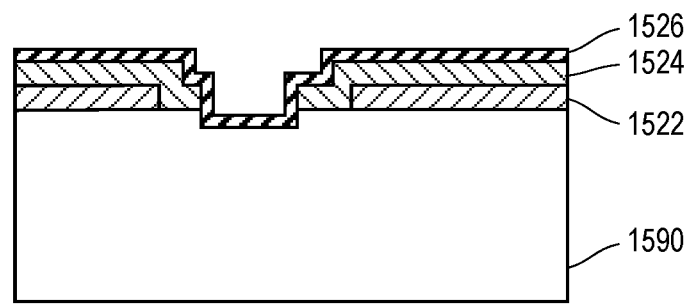
Figure 15F:
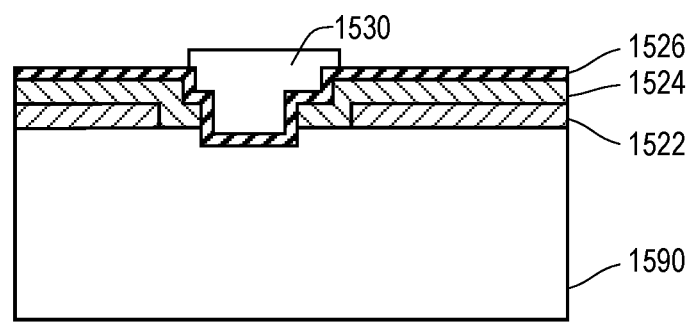
Figure 15G:
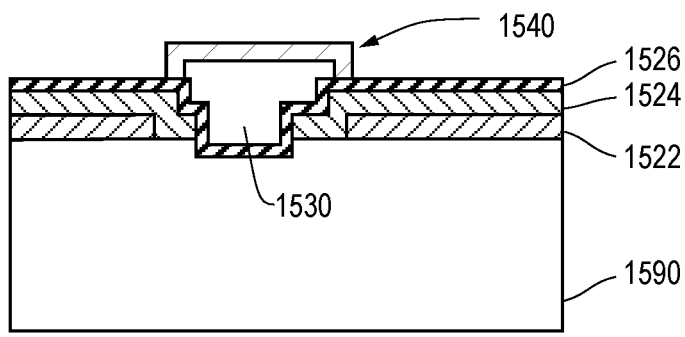
Figure 15H:
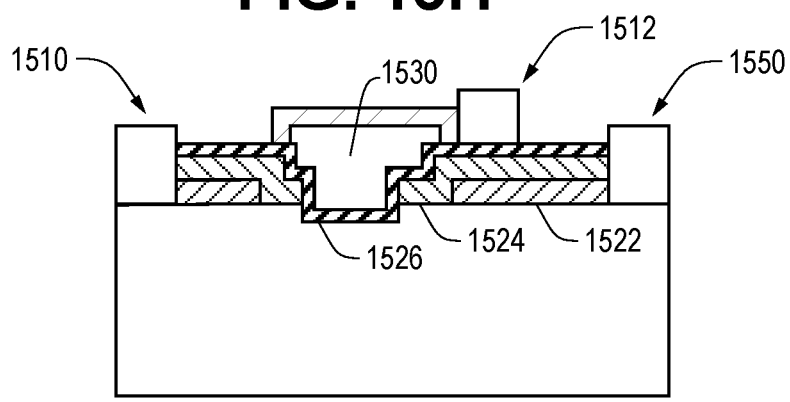
Figure 15J:
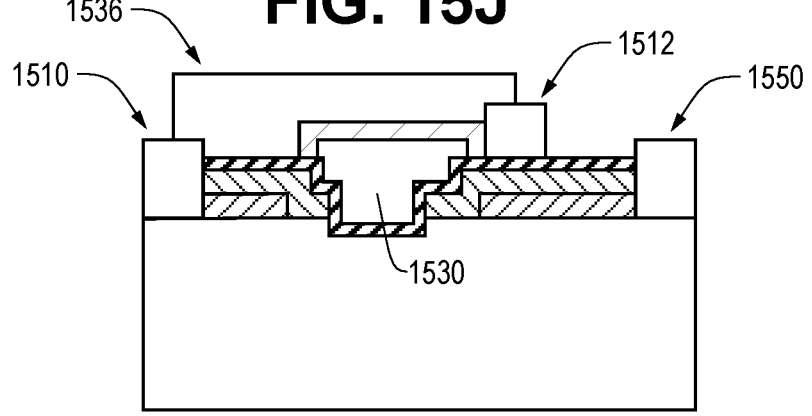

FIGS. 15A-15J show respective cross-sectional views of the gate-encapsulated field-plate transistor 900 in FIG. 9, depicted in successive stages of fabrication, according to one embodiment of the present invention. In FIG. 15A, a first field-plate dielectric layer 1522 may be deposited on a substrate 1590. In FIG. 15B, an etching step may be performed using an etching technique to remove a portion of first field-plate dielectric layer 1522 to form gate opening 1532. In FIG. 15C, a second field-plate dielectric layer 1524 may be deposited on top of first field-plate dielectric layer 1522. As previously disclosed, the two field-plate dielectric layers may comprise the same or different dielectric materials. In FIG. 15D, a second etching step is performed to form a recess, or gate opening 1534 into second field-plate dielectric layer 1524 and substrate 1590. In FIG. 15E, a gate dielectric layer 1526 is deposited. In FIG. 15F, a gate 1530 with stepped gate field plates may be formed in the gate opening through the field-plate dielectric layers. Gate 1530 with stepped gate field plates may be formed of any suitable conductor or semiconductor materials. In FIG. 15G, an encapsulating dielectric layer is deposited on top of gate 1530 and gate dielectric layer 1526, and an etching step may be performed to remove portions of this encapsulating dielectric layer to form a gate-encapsulating dielectric 1540. In FIG. 15H, source and drain regions may be formed, as understood by those of ordinary skill in the art, by etching into field-plate dielectric layers 1522, 1524, and gate dielectric layer 1526. Source and drain ohmic contacts 1510 and 1550, as well as source field plate 1512 may be formed concurrently in the same step or sequentially. In some embodiments, sequences of metallization steps may be used to construct a core-shell structure for one or more of source ohmic contact 1510, source field plate electrode 1512, gate contact 1530, and drain ohmic contact 1550. An external electrical connection between source ohmic contact 1510 and source field plate 1512 may then be established.

In another aspect of the present invention, a semiconductor device is made by a process comprising the aforementioned steps.

Capacitively-Coupled Field-Plate Structures

Figure 16:
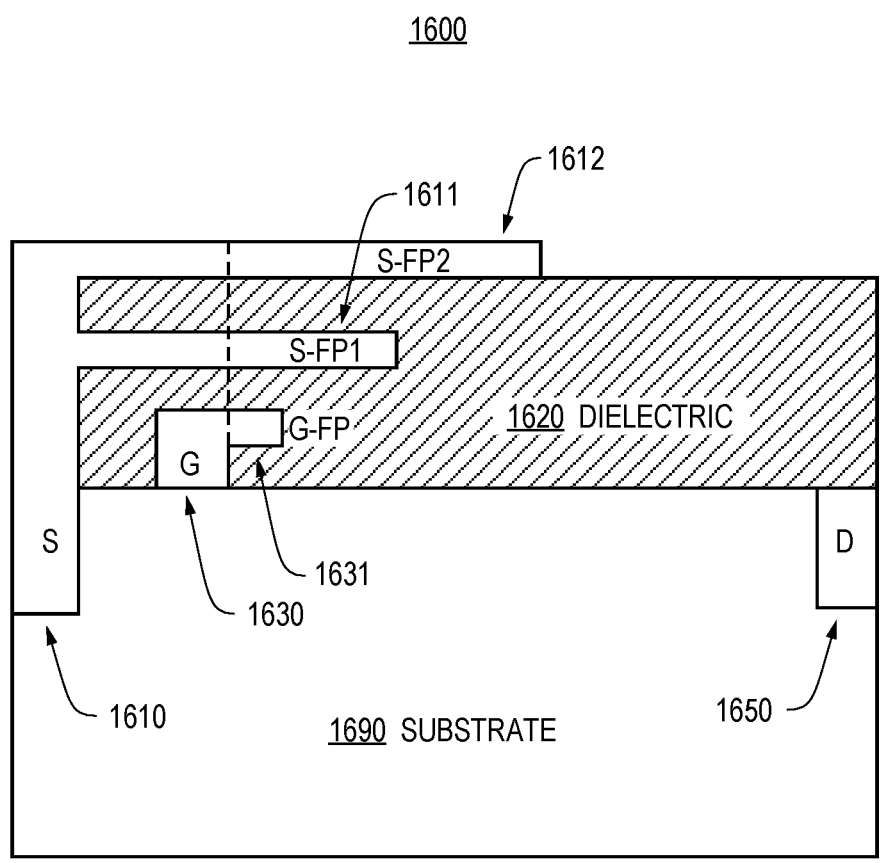
FIG. 16 shows a cross-sectional view of a transistor having a conventional field-plate structure with two source field plates and one gate field plate.

While FIGS. 1 to 15J are directed to field-plate transistors with a single source field plate, FIG. 16 shows a cross-sectional view of a conventional field-plate transistor with two source field plates and a gate field plate. A gate 1630 is deposited on substrate 1690 between a source 1610 and a drain 1650, and connected to a gate field plate (G-FP) 1631 directly. In addition, two source field plates S-FP1 1611 and S-FP2 1612 are connected to source 1610 directly, with source field plate 1612 positioned above source field plate 1611, and separated from source field plate 1611 by field-plate dielectric 1620. Each of field plates 1631, 1611, and 1612 are separated and encapsulated by field-plate dielectric 1620. Moreover, field plates 1631, 1611, and 1612 have increasing lengths, increasing thicknesses of dielectric materials underneath, and increasing pinch-off voltages for the channel within substrate 1690 underneath each field plate. As a result, in the off-state of the transistor, the electric field between gate 1630 and drain 1650 is spread out by the gate and source field plates, thus extending the breakdown voltage of the device.

As the desired device breakdown voltage increases, more source-connected field plates may be added by further increasing the number of dielectric and field plate layers within the stack. However, each new field plate requires an additional set of fabrication steps including dielectric deposition, etching, and metal deposition, with increasing fabrication cost and complexity. Device characteristics may also suffer from variations in dielectric thickness and field plate alignment errors as the spread of electric field is sensitive to dielectric thickness and relative positions of field plate edges. In short, although a large number of field plates is desirable for better spreading the electric field distribution, increased manufacturing variation and fabrication cost make having more than two or three field plates difficult using the conventional field-plate structure as illustrated by transistor 1600 shown in FIG. 16.

Figure 17A:
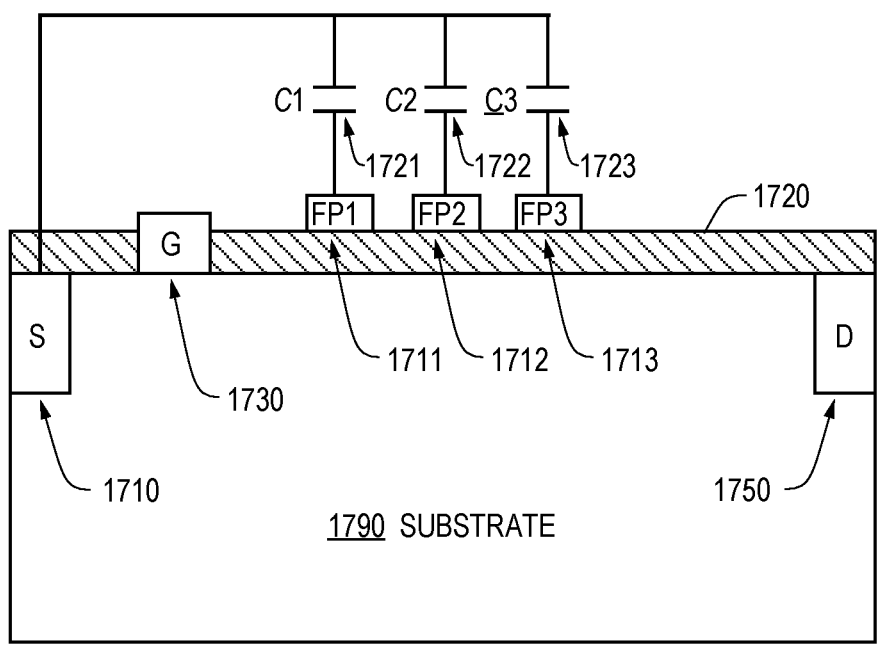
FIG. 17A shows a cross-sectional view of an exemplary transistor having capacitively-coupled field plates, according to one embodiment of the present invention.
Figure 17B:
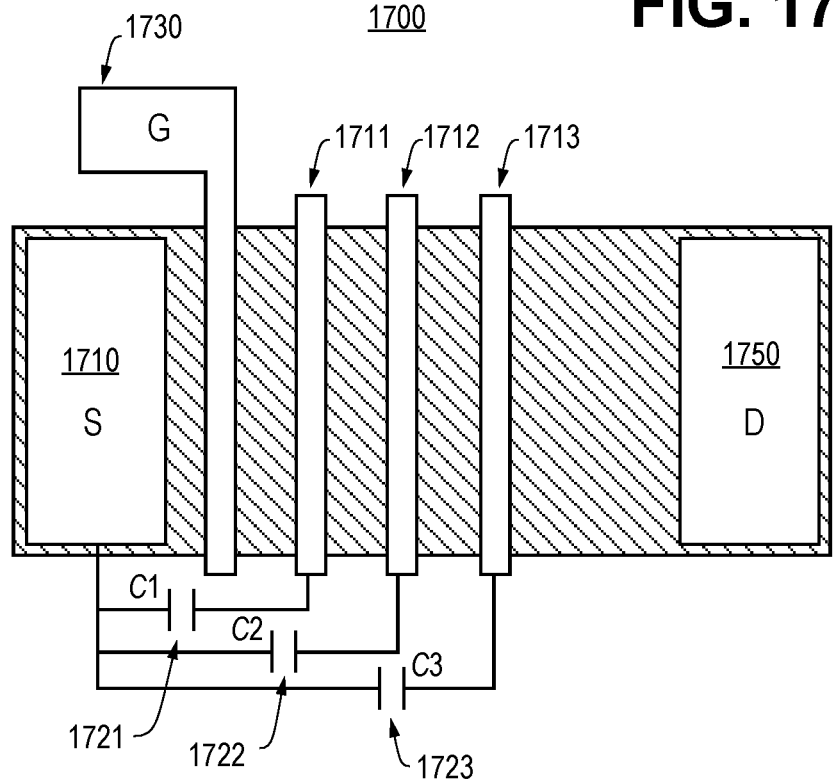
FIG. 17B shows a top view of the transistor having capacitively-coupled field plates in FIG. 17A.

FIG. 17A shows a cross-sectional view of an exemplary field plate transistor 1700 with capacitively-coupled field plates, according to one embodiment of the present invention. FIG. 17B shows a top view of the field plate transistor 1700 in FIG. 17A.

In transistor 1700, a gate 1730 is deposited on a substrate 1790 between a source 1710 and a drain 1750. Substrate 1790 comprises necessary epitaxy layers to form transistors, and may include, for example, Group IV, Group III-V, Group II-VI semiconductor materials such as diamond, Si, SiC, Ge, ZnO, ZnO$_2$, Ga$_2$O$_3$, In$_x$Al$_y$Ga$_z$As (0≤x≤1, 0≤y≤1, 0≤z≤1, x+y+z=1), GaN, AlGaN, and In$_x$Al$_y$Ga$_z$N (0≤x≤1, 0≤y≤1, 0≤z≤1, x+y+z=1). In some embodiments, substrate 1790 may comprise a channel layer. In some embodiments, substrate 1790 may further comprise a barrier layer formed on the channel layer, with a wider bandgap than that of the channel layer. Such a barrier layer may include one or more epitaxy sub-layers formed of the aforementioned Group IV, Group III-V, Group II-VI semiconductor materials. In some embodiments, gate 1730 may be formed over the barrier layer, with or without a gate dielectric layer in-between. Exemplary gate dielectric materials include, but are not limited to, Al$_2$O$_3$, Si$_x$O$_y$, Si$_x$N$_y$, Si$_x$O$_y$N$_z$, Teflon, HfO$_2$, and any other dielectric with a dielectric constant below 200. Transistor 1700 may be, for example, a metal oxide field effect transistor (MOSFET), a metal insulator field effect transistor (MISFET), a metal semiconductor field effect transistor (MESFET), or a high electron mobility transistor (HEMT).

In this particular example, three non-overlapping field plates FP1 1711, FP2 1712, and FP3 1713 are formed on a field-plate dielectric 1720 disposed on the top surface of substrate 1790. Exemplary materials for field-plate dielectric 1720 include, but are not limited to, Si$_x$N$_y$, Si$_x$O$_y$, Al$_2$O$_3$, AlN, SiO$_x$N$_y$, Teflon, and HfO$_2$. Each field plate is capacitively connected to source 1710. In this embodiment, gate 1730 is disposed directly on substrate 1790, through an etched opening on field-plate dielectric 1720. Although three field plates are shown in FIG. 17A, various embodiments of the present invention may include any non-zero number of field plates formed between gate 1730 and drain 1750. In addition, in some embodiments, field-plate dielectric 1720 may be entirely or partially absent across the top surface of substrate 1790, with one or more field plates disposed directly on substrate 1790, with or without recesses etched into the substrate. In some other embodiments, field-plate dielectric 1720 may be layered with multiple dielectric materials, etched at selective regions, or stepped appropriately so field-plate dielectric thickness below each field plate is any non-negative value attainable through available fabrication techniques. In yet some other embodiments, the capacitively-coupled field-plate structures as disclosed herein may be combined or integrated with other field-plate structures, including the conventional field-plate structure with stacked field plates as illustrated by FIG. 16.

Unlike conventional field-plate structures where field plates are stacked on top of one another, necessitating increasing field-plate lengths and increasing field-plate dielectric thicknesses, the field-plate structure shown in FIG. 17A does not require an increasing dielectric thickness for each field plate electrode, and all three field plate electrodes 1711, 1712, and 1713 may be formed on a same planar dielectric layer 1720, possibly concurrently to significantly reduce the number of manufacturing steps. Consequently, many more field plate electrodes can be formed than in the convention structure without additional fabrication processes.

In the exemplary transistor 1700, all three field plates 1711, 1712, and 1713 in transistor 1700 are capacitively coupled to source 1710, through capacitors 1721, 1722, and 1723 with capacitances C1, C2, and C3, respectively. External or integrated interconnections may be made to electrically connect one terminal of a capacitor to source electrode 1710, and the other terminal of the capacitor to a corresponding field plate electrode. In a convention field-plate structure where each source field plate is directly connected to the source, field plate voltages are the same as the source voltage level, and field-plate dielectric thickness and alignment must be carefully designed to achieve a desired electrical field in the semiconductor device. By comparison, capacitive coupling of field plates 1711, 1712, and 1713 to source 1710 in the illustrative embodiment shown in FIG. 17A allows field plate voltages to be individually adjusted, thus enabling much better electrical field control and management.

To manage the electrical field within transistor 1700, coupling capacitors 1721, 1722, and 1723 may be configured to set increasing potentials on field plates 1711, 1712, and 1713, from gate electrode 1710 towards drain electrode 1750. Thus, during off-state operations of the transistor, field-plate voltages may satisfy $V_{FP1} < V_{FP2} < V_{FP3}$. Since each field plate electrode has the same pinch-off voltage ($V_{pinch-off}$) to deplete a channel such as a two-dimensional electron gas (2DEG) underneath, field plate potentials set the potential in the channel to approximately $V_{FP1} + V_{pinch-off} < V_{FP2} + V_{pinch-off} < V_{FP3} + V_{pinch-off}$, and the electric field between gate 1710 and drain 1750 may be controlled to have a smooth profile.

For the same field-plate electrode length, coupling capacitors 1721, 1722, and 1723 shown in FIG. 17A need decreasing capacitances C1>C2>C3 to achieve increasing field plate voltages $V_{FP1} < V_{FP2} < V_{FP3}$. Nonetheless, the capacitively-coupled field-plate structure as illustrated by this particular example provides full freedom in choosing a number of field plates, field plate lengths, field-plate separations, and field-plate dielectric thicknesses to achieve a desired electrical field profile. More generally, in some embodiments, only a non-empty subset of all field plates is capacitively coupled to the source electrode, each through one or more capacitors connected in series or in parallel. In some embodiments, instead of coupling each field plate to the source individually, a capacitor network may be used to jointly control field plate voltages and the resulting electrical field profile.

To form the capacitively-coupled field-plate structure 1700 shown in FIG. 17A, a semiconductor substrate 1790 is first formed, followed by the formation of source ohmic contact 1710 and drain ohmic contact 1750 on substrate 1790. A field-plate dielectric 1720 comprising one or more layers of dielectric materials may then be disposed over substrate 1790, and further etched for the formation of gate contact 1730 between source 1710 and drain 1750. One or more field plate electrodes such as field plates 1711, 1712, and 1713 may then be deposited on field-plate dielectric 1720. Such field plates may have the same or different length and areas. Next, one or more capacitors may be formed, externally or through integrated implementations. Subsets of capacitors thus formed may be connected in series or in parallel, and interconnections may also be formed to electrically connect one terminal of each set of interconnected capacitors to source contact 1710, and the other terminal of the set of interconnected capacitors to a field-plate electrode, so the field-plate electrode is capacitively coupled to source 1710. Similar field plates may be constructed and capacitively coupled to gate electrode 1730 as well. In some embodiments, capacitively-coupled field-plate structures such as 1700 shown in FIG. 17 may be fabricated through process steps as illustrated by FIGS. 13A to 15J. For example, after field plate dielectric deposition, gate and field plate electrodes may be formed, followed by source and drain electrodes. Capacitors may then be formed to couple the field plates to the source electrode.

Coupling capacitors as discussed herein may be external capacitors in the circuit, but they may also be integrated with the device. One possible embodiment of the disclosed coupling capacitors is to form Metal-Insulator-Metal (MIM) capacitor structures using an additional dielectric layer and a top metal layer, either outside or over the device active region.

Figure 18:
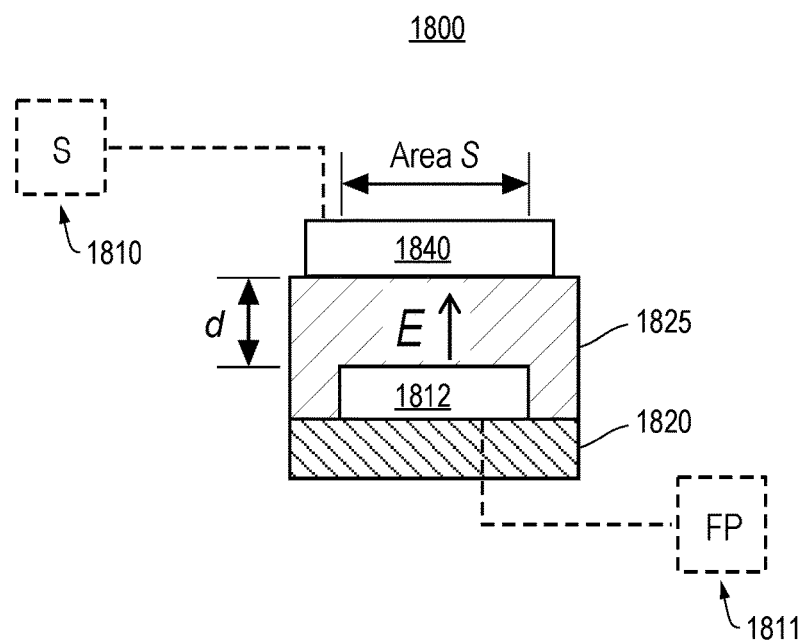
FIG. 18 shows a cross-sectional view of a Metal-Insulator-Metal capacitor, according to one embodiment of the present invention.

More specially, FIG. 18 shows a cross-sectional view of a MIM capacitor 1800, according to one embodiment of the present invention. MIM capacitor 1800 may be made by first forming a lower metal plate or terminal 1812 on a dielectric 1820, depositing an additional dielectric layer 1825 on top of metal plate 1812, and forming an upper metal plate or terminal 1840 on dielectric 1825. Exemplary materials for dielectric layer 1825 include, but are not limited to, $Al_2O_3$, $Si_xO_y$, $Si_xN_y$, $Si_xO_yN_z$, Teflon, $HfO_2$, and any other dielectric with a dielectric constant below 200. Upper metal plate 1840 overlaps with lower metal plate 1812 at least partially, by a capacitor area S. The two parallel metal plates are separated by a distance d. The capacitance $C_A$ of MIM capacitor 1800 may be computed as $\in S/d$, where $\in$ is the dielectric constant of dielectric 1825. In addition, a potential difference $V_A$ across the parallel plates may be computed as Ed, where E is the electrical field intensity. Thus, capacitance of MIM capacitor 1800 may be varied by its dielectric thickness, dielectric constant, and capacitor area. MIM capacitor 1800 as illustrated in FIG. 18 may be used to capacitively couple a field plate 1811 to a source electrode 1810, by electrically connecting lower metal plate 1812 to field plate 1811, and electrically connecting upper metal plate 1840 to source 1810. In some embodiments where MIM capacitor 1800 is formed over the device active region, top metal plate 1840 may be directly connected to a source, and bottom metal plate 1812 may serve as a field plate itself, eliminating the optional electrical connection to another optional field plate such as 1811. In some embodiments, one of metal plates 1812 and 1840 may be formed by a channel layer of the semiconductor device which capacitor 1800 is integrated with.

Figure 19:
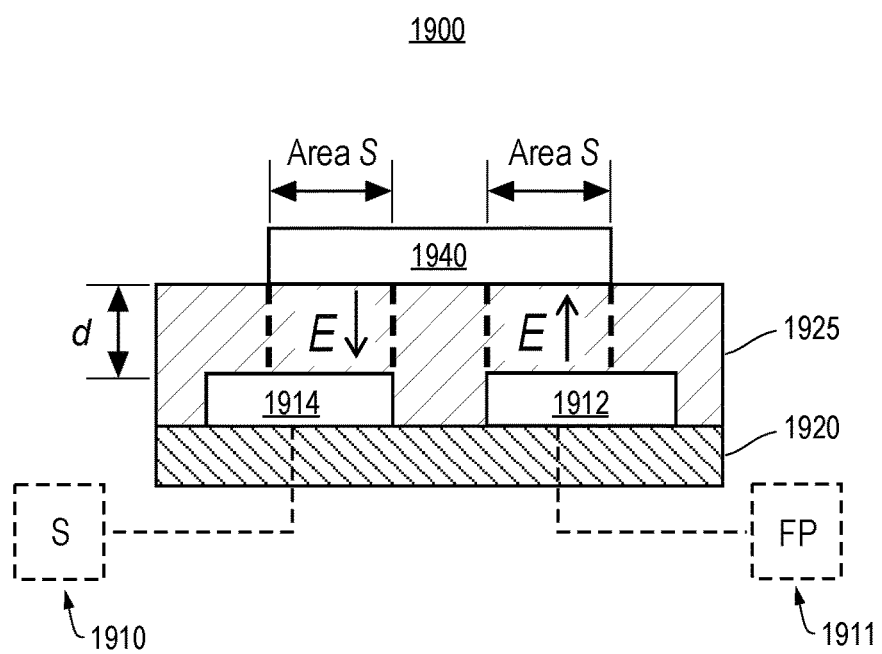
FIG. 19 shows a cross-sectional view of a Metal-Insulator-Metal capacitor, according to another embodiment of the present invention.

FIG. 19 shows a cross-sectional view of a MIM capacitor structure 1900, according to another embodiment of the present invention. Compared with MIM capacitor 1800 in FIG. 18, MIM capacitor structure 1900 in FIG. 19 utilizes different overlapping areas and includes two parallel-plate MIM capacitors in a series connection. More specifically, MIM capacitor structure 1900 may be made by sequentially forming lower metal plates 1912 and 1914 on a dielectric 1920, depositing an additional dielectric layer 1925 on top of the lower metal plates, and forming an upper metal plate 1940 on dielectric 1925. Exemplary materials for dielectric layer 1925 include, but are not limited to, $Al_2O_3$, $Si_xO_y$, $Si_xN_y$, $Si_xO_yN_z$, Teflon, $HfO_2$, and any other dielectric with a dielectric constant below 200. Upper metal plate 1940 overlaps with lower metal plates 1912 and 1914 at least partially, by a capacitor area S in this example. The parallel metal plates are separated by a distance d. MIM capacitor structure 1900 may be viewed as two parallel-plate capacitors connected in series. The capacitance $C_B$ of MIM capacitor structure 1900 may be computed as $\in S/2\ d$, where $\in$ is the dielectric constant of dielectric 1925. A potential difference $V_B$ across the parallel plates may be computed as 2Ed, where E is the electrical field intensity. Thus, capacitance of MIM capacitor structure 1900 may be varied by dielectric thickness, dielectric constant, and capacitor area of each component capacitor unit, and the configuration of electrical connections among component capacitors. MIM capacitor structure 1900 as illustrated may be used to capacitively couple a field plate 1911 to a source electrode 1910, by electrically connecting lower metal plate 1912 to field plate 1911, and electrically connecting lower metal plate 1914 to source electrode 1910. In some embodiments where MIM capacitor structure 1900 is formed over the device active region, one or both of bottom metal plates 1912 and 1914 may serve as a field plate, thus eliminating the optional electrical connection to another optional field plate such as 1911.

In various embodiments, different overlapping areas and parallel or series connections of integrated capacitors may be used to achieve different capacitor sizes and capacitance values, as illustrated by the two examples shown in FIGS. 18 and 19. In addition, a coupling MIM capacitor may have one of its terminals formed in one metallization step, and the other terminal formed in another metallization stop on top of a capacitor dielectric over the first terminal. Alternatively, a coupling MIM capacitor may have one of its terminals formed in a semiconductor substrate in one metallization step, and the other terminal formed in another metallization step on top of a capacitor dielectric over the first terminal. For example, a coupling MIM capacitor may use a 2DEG in a heterostructure as a metal capacitor terminal, as discussed with respect to FIGS. 23A to 23C herein.

Figure 20:
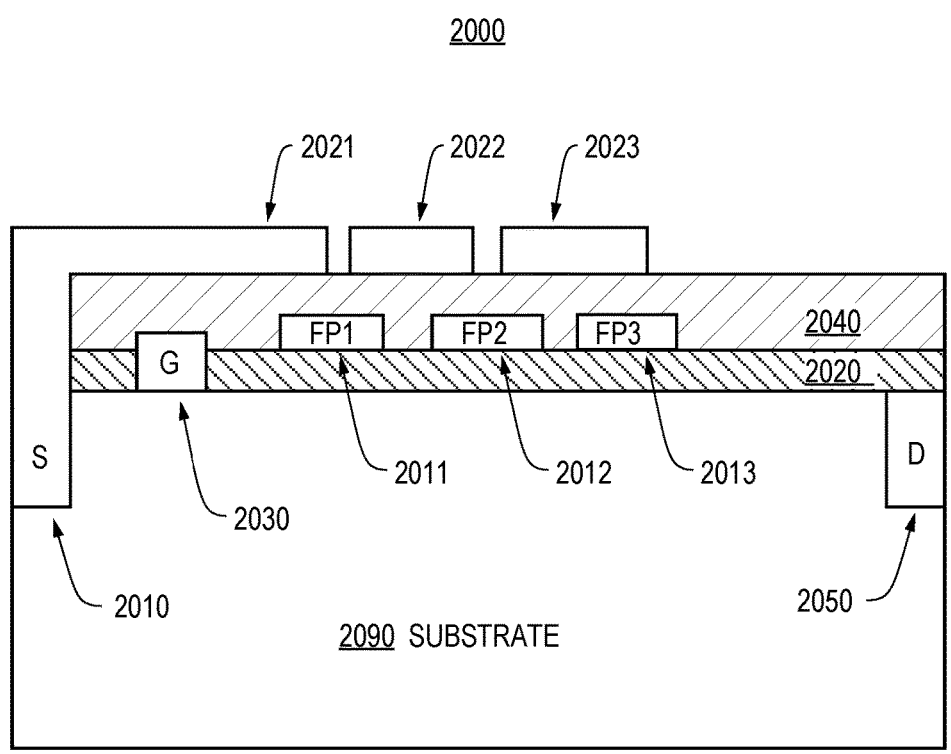
FIG. 20 shows a cross-sectional view of an exemplary transistor having field plates capacitively coupled to the source using integrated Metal-Insulator-Metal capacitors, according to one embodiment of the present invention.

FIG. 20 shows a cross-sectional view of an exemplary field plate transistor 2000 with field plates capacitively coupled to a source 2010 using integrated MIM capacitors, according to one embodiment of the present invention. Similar to field plate transistor 1700 shown in FIG. 17A, three field plates 2011, 2012, and 2013 are formed on a field-plate dielectric 2020, between a gate contact 2030 and a drain ohmic contact 2050. Field-plate dielectric 2020 is disposed on a substrate 2090. Furthermore, an additional dielectric layer 2040 is deposited to encapsulate gate 2030 as well as all three field plates. Lastly, coupling electrodes 2021, 2022, and 2023 are formed on dielectric layer 2040. In some embodiments, field plate electrodes 2011, 2012 and 2013 are formed with the same metallization step with gate electrode 2030. In some embodiments, coupling electrodes 2021, 2022 and 2023 are formed in another metallization step, and electrically connected to source electrode 2010. Transistor 2000 may be viewed as a particular instance of the capacitively-coupled field-plate structure shown in FIG. 17A. Assuming coupling electrode 2021 overlaps with field plate 2011 by an area S, coupling electrode 2022 overlaps with each of field plates 2011 and 2012 by an area S, coupling electrode 2023 overlaps with each of field plates 2012 and 2013 by an area S, and a separation distance d between the coupling electrodes and the field plates, the coupling capacitance connected to field plates 2011, 2012, and 2013 may be computed as $\in S/d$, $\in S/3\ d$, and $\in S/5\ d$ respectively.

Figure 21A:
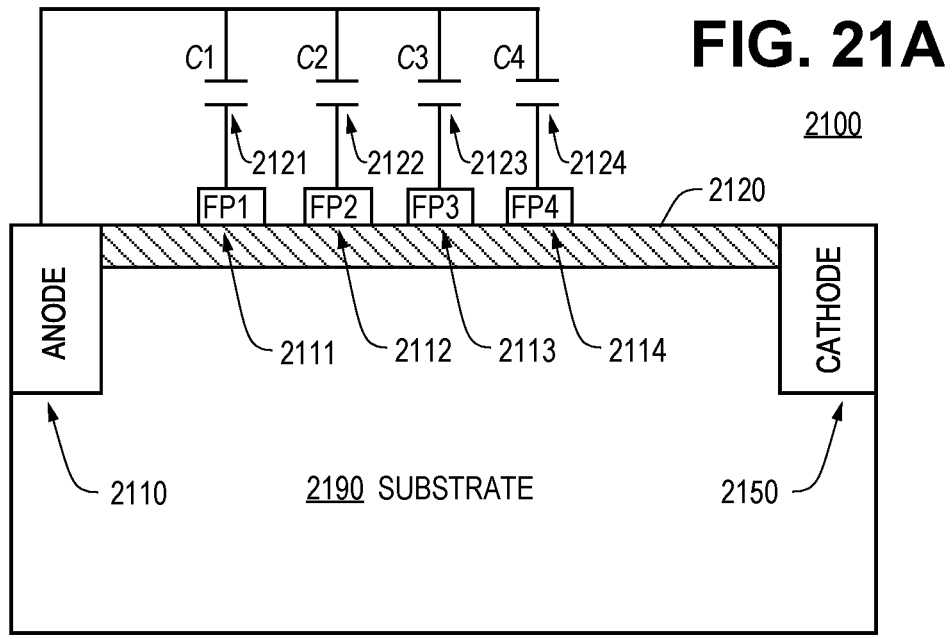
FIGS. 21A and 21B show respective cross-sectional and top views of an exemplary diode having capacitively-coupled field plates, according to one embodiment of the present invention.
Figure 21B:
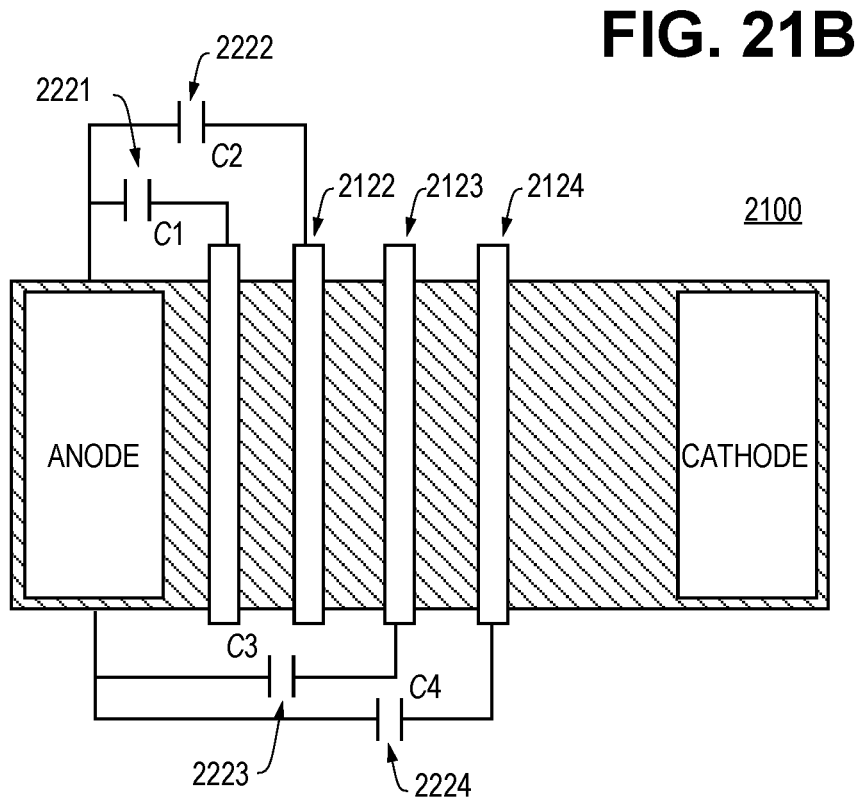

In addition to transistors as discussed with respect to FIGS. 17A to 20, the capacitively-coupled field-plate structure as disclosed herein may be applied to other semiconductor devices with field plates as well. FIG. 21A shows a cross-sectional view of an exemplary diode 2100 having capacitively-coupled field plates, according to one embodiment of the present invention; FIG. 21B shows a corresponding top view of diode 2100 in FIG. 21A.

In this particular example, four field plates 2111, 2112, 2113, and 2114 are formed over a field-plate dielectric 2120 between an anode 2110 and a cathode 2150, on top of a substrate 2190. Field plates 2111, 2112, 2113 and 2114 as shown are coupled to anode 2110 through coupling capacitors 2121, 2122, 2123, and 2124 respectively. The formation of and interconnections among the field-plate electrodes and coupling capacitors may be the same as in the aforementioned transistor devices.

In addition to coupling field-plate electrodes to a source electrode in a transistor as shown in FIGS. 17A to 20, or to an anode electrode in a diode as shown in FIGS. 21A and 21B, one or more field plate electrodes may be coupled to another terminal or electrode in a device or circuit which has a potential lower than the maximum off-state voltage of the device. Generally, embodiments of the present invention significantly simplify the fabrication process to lower manufacturing cost, while providing much more flexibility in the scaling of device breakdown voltage and management of electrical field profile within the device. With this new field-plate structure and integrated coupling capacitors, many field-plates with different voltage levels can be formed with only a few fabrication steps, overcoming the obstacles of the conventional field-plate design. The fabrication of this new field-plate structure is also compatible with standard GaN-based process, and it can be applied to many other device structures, such as Si, GaAs, $Ga_2O_3$, AlN, SiC, diamond-based power and RF devices. This field-plate structure may also be applied to different transistor technology, including enhancement-mode transistors, depletion-mode transistors, transistors with gate dielectric or Schottky gate, and transistors with multiple layers of barriers with gate recess.

Figure 22A:
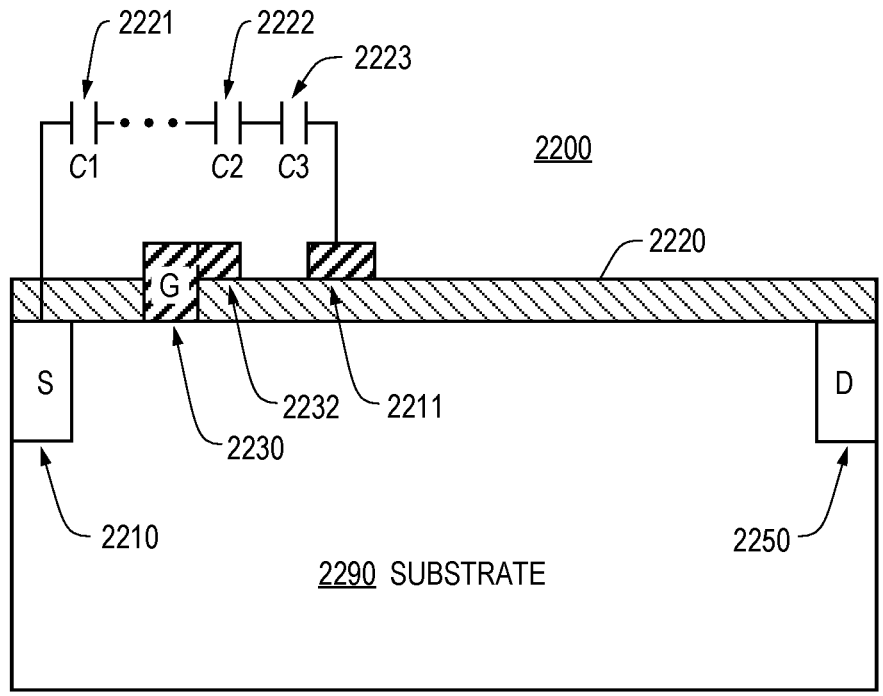
FIGS. 22A and 22B show respective cross-sectional and top views of an exemplary transistor having a gate field plate and a capacitively-coupled source field plate, according to one embodiment of the present invention.
Figure 22B:
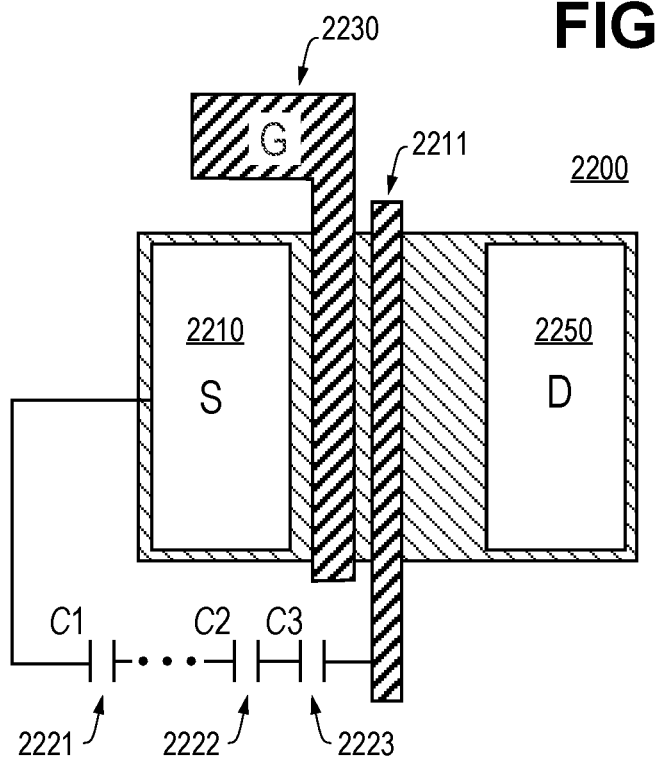

Yet another example of a capacitively-coupled field plate transistor is illustrated by FIG. 22A, which shows a cross-sectional view of a field plate transistor 2200 with a source field plate 2211 coupled to a source electrode 2210 through a series of capacitors including capacitors 2221, 2222, and 2223. FIG. 22B shows a top view of transistor 2200 in FIG.

22A, with only one source field plate finger 2211 made between gate 2210 and drain 2250. Source field plate 2211 is connected to source 2210 through a series of capacitors. In this example, gate 2230 is formed with a gate field plate 2232 extending laterally over field-plate dielectric 2220 from gate 2230 towards a drain 2250.

One advantage of the structure shown in FIGS. 22A and 22B is that a single layer of field-plate dielectric may be used to implement both a gate field plate and a source field plate in transistor 2200 whereas a conventional dual-field-plate transistor as shown in FIG. 1 would require two field-plate dielectric layers. This particular capacitively-coupled structure is also similar to the gate-encapsulated dual-field-plate structure shown in FIG. 9, where source field plate 912 is physically separate but electrically connected to source 910.

Another advantage of the structure shown in FIGS. 22A and 22B is that a single layer of field-plate dielectric may be used to implement a gate field plate and a single source field plate, yet allowing a high breakdown voltage for transistor 2200. Recall from the conventional field plate transistor 100 in FIG. 1 and the conventional field plate transistor 1600 in FIG. 16 that the number of field plates must increase to withstand or tolerate higher breakdown voltages. Nonetheless, a high breakdown voltage is enabled in transistor 2200 with a single source field plate because external capacitors such as 2221, 2222, and 2223 may each bear a certain amount of voltage drop. In some embodiments, such external capacitors can be thin film dielectric MIM capacitors as disclosed previously.

Figure 23A:
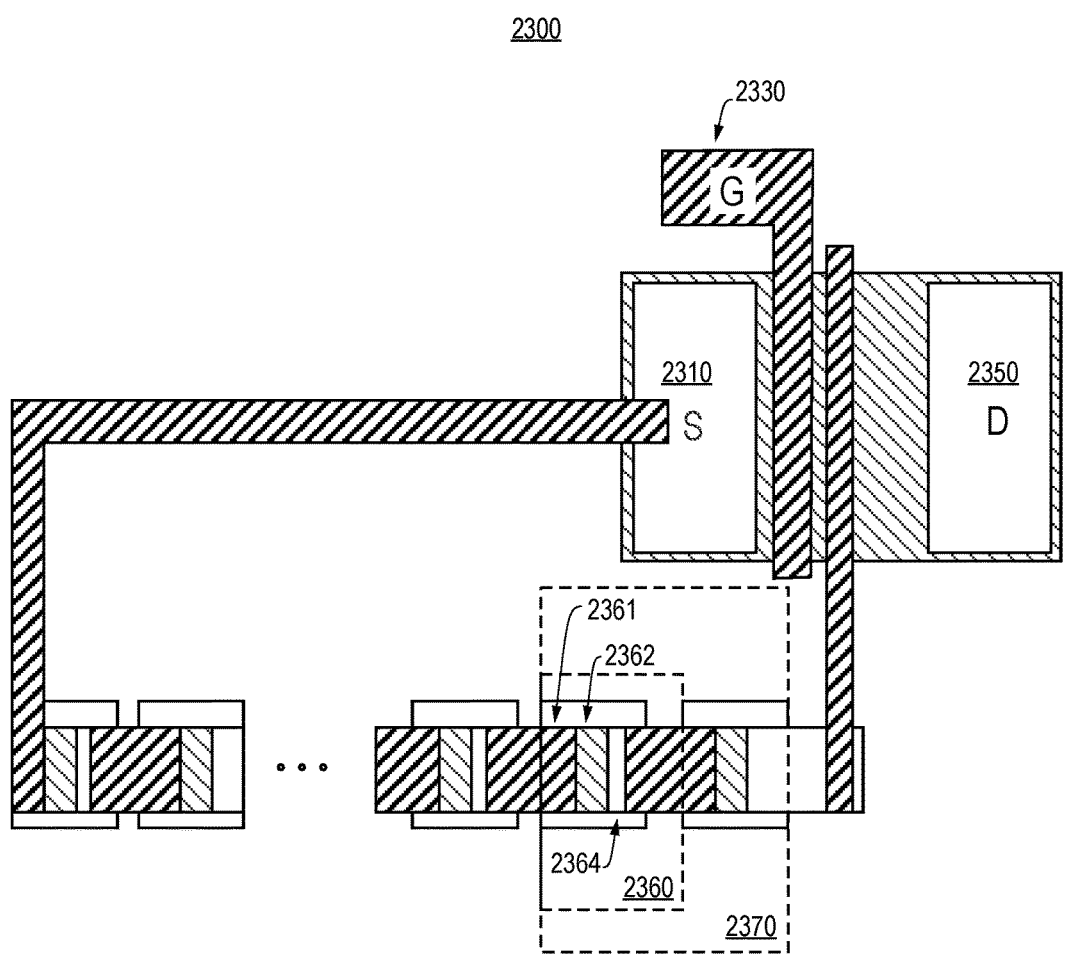
FIG. 23A shows a top view of an integrated implementation of the transistor in FIGS. 22A and 22B, according to one embodiment of the present invention.

In some other embodiments, external capacitors 2221, 2222, and 2223 shown in FIGS. 22A and 22B may be implemented as a special integrated chain of structures outside the device active region. As an example, FIG. 23A shows a top view of a capacitively-coupled, dual-field-plate III-N transistor 2300 with integrated capacitors in a series connection, according to one embodiment of the present invention. In transistor 2300, capacitors are formed through isolated islands such as island 2360 within island region 2370. Each island may be electrically isolated from another through mesa etching, ion implementation, or a combination of both. A cross-sectional view of island region 2370 is provided in FIG. 23B.

Figure 23B:
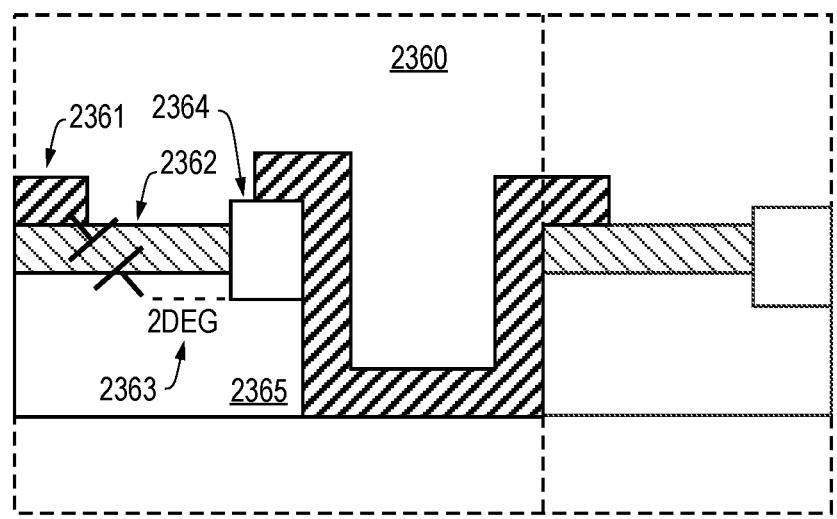
FIGS. 23B and 23C show respective cross-sectional views of integrated capacitor units for coupling a field plate to a source in the transistor shown in FIG. 23A, according to one embodiment of the present invention.

As shown in FIGS. 23A and 23B, inside island 2360, a metal layer 2361 is disposed on a dielectric 2362. In some embodiments, metal layer 2361 may be formed concurrently with gate 2330, and dielectric 2362 may be the same dielectric layer as disposed underneath a gate field plate extending from gate 2330. Dielectric 2362 is disposed on a substrate 2365, which may be a III-N semiconductor. An ohmic contact 2364 connects to a 2DEG 2363 in this III-N semiconductor heterostructure. Ohmic contact 2364 may be formed together with transistor ohmic contacts 2310 and 2350. Metal 2361, field-plate dielectric 2362, 2DEG 2363, and ohmic contact 2364 form a unit cell of a series of capacitors.

External capacitors as discussed with respect to FIGS. 23A and 23B may withstand a few hundred volts, depending on the distance between capacitor electrodes and the capacitor dielectric thickness. Compared with thin film dielectric MIM capacitors, this new capacitor design uses both a dielectric capacitance and a depletion capacitance of the III-N semiconductor 2365. To bear a few hundred volts, a MIM capacitor may need a few micrometers-thick of dielectric. In comparison, the new semiconductor capacitor as disclosed herein may need only a few hundred nanometers of dielectric, thus providing better manufacturability with lower costs. In addition, as this unit cell employs depletion capacitance in the semiconductor layer, when the applied voltage increases, the effective length of the depletion region increases, and more voltage may be tolerated. Cascading such unit cells makes the total tolerable voltage increase with the total number of cells.

Figure 23C:
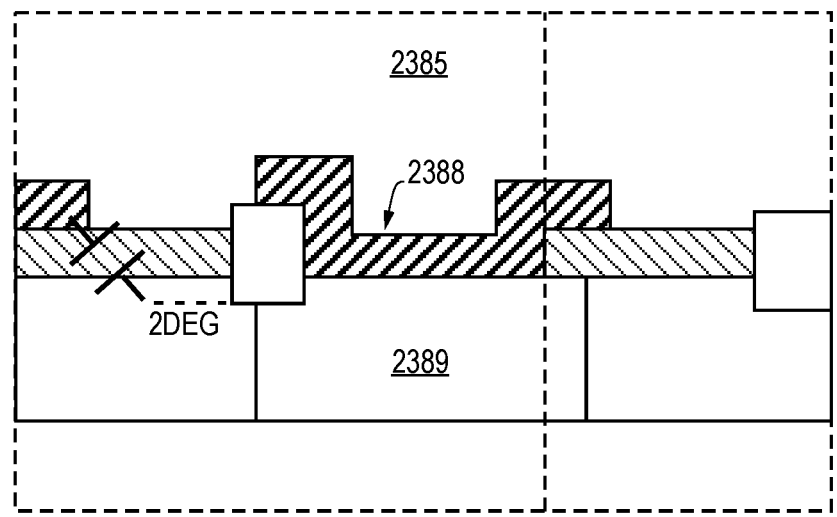

As another example, FIG. 23C shows a cross-sectional view 2380 of another capacitor island 2385 that may be used instead of island 2360, according to another embodiment of the present invention. In this example, individual capacitors in the chain are no longer isolated through mesa islands. Instead, a region 2389 with implanted ions serves for isolation. In some other embodiments, mesa etching may be used, and a dielectric may be used to fill mesa gaps to make 2389 level evenly with the semiconductor material.

Core-Shell Structures for Gold-Free Metal Contacts

Contacts such as the source, drain, gate, and field plate electrodes disclosed herein provide electrical connectivity among different components in an integrated circuit, and are typically made of metal with good conductive properties. Aluminum and copper are generally used in silicon-based devices, whereas gold is commonly used in III-V devices including high-frequency, high-power III-N semiconductor devices such as AlGaN/GaN High Electron Mobility Transistors (HEMTs). In a HEMT, current is injected via a drain ohmic contact, and collected by a source ohmic contact. Current through the device is modulated by voltages applied through a Schottky gate contact. Reliable and reproducible ohmic and Schottky contacts with low-resistance and good edge acuity are necessary. Most low-resistance ohmic contacts in III-N devices use Gold (Au) as the top layer to reduce sheet resistance underneath the ohmic contact region, and to decrease oxidation during high temperature annealing. Au-based gate is also used in Schottky contacts to reduce the gate resistance.

Nevertheless, the presence of Au in a silicon manufacturing facility such as a CMOS foundry can pose serious contamination concerns, as gold diffuses very easily into silicon. On one hand, gold cannot be used in CMOS silicon fabs. On the other hand, other materials compatible with CMOS processing either have higher contact resistances, or can not withstand high temperature processing as well as gold. In view of such challenges, a novel core-shell structure is disclosed herein for making CMOS compatible, gold-free metal contacts with low contact resistances.

Figure 24:
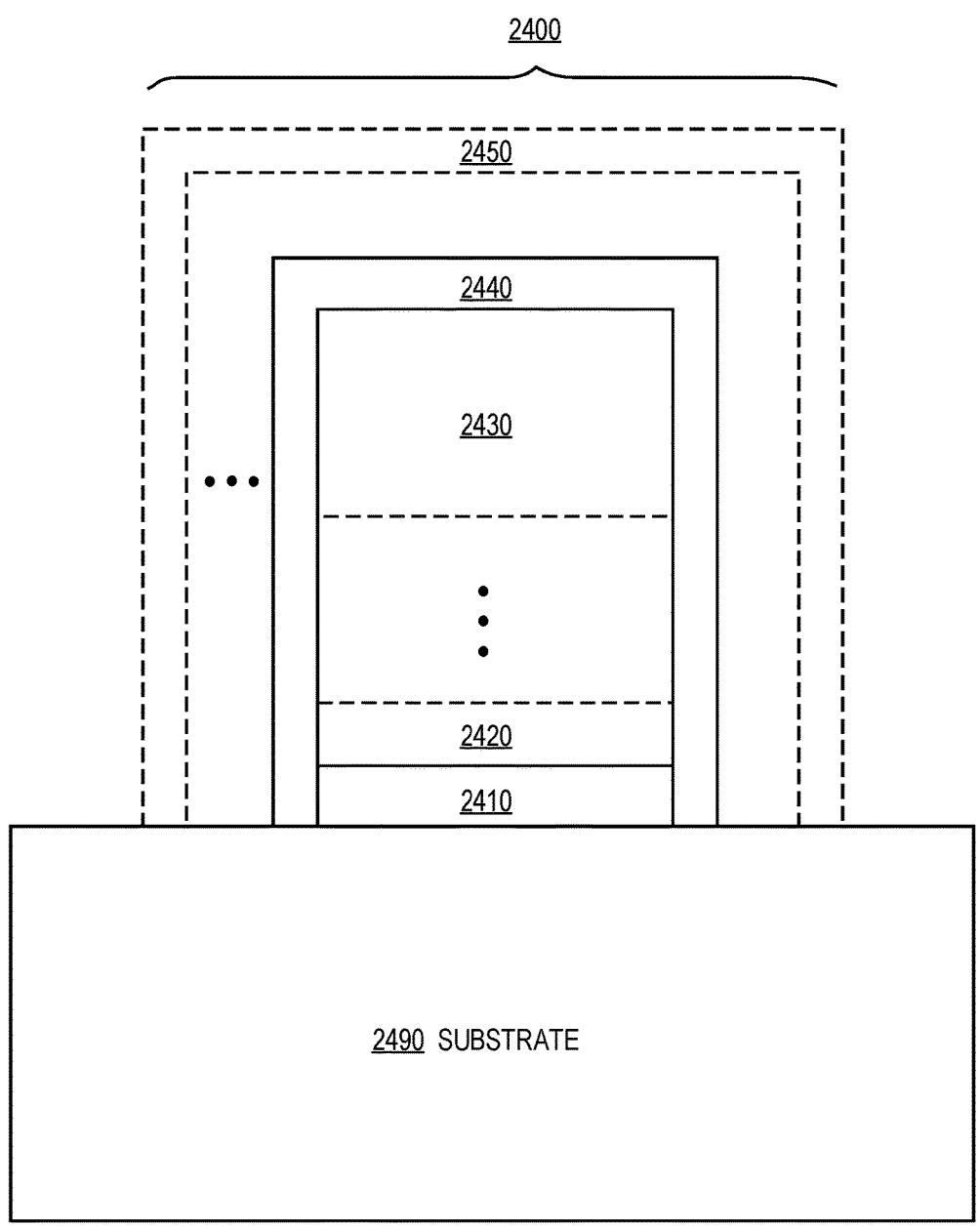
FIG. 24 shows a core-shell structure for forming a gold-free electrode, according to one embodiment of the present invention.

FIG. 24 shows a core-shell structure for forming a gold-free metal contact 2400, according to one embodiment of the present invention. Metal contact 2400 comprises a core and an encapsulating shell. The core is formed by a sequential deposition of one or more CMOS-compatible core layers such as layers 2410, 2420, and 2430; the core-encapsulating shell is formed by sequential deposition and etching of one or more CMOS-compatible, refractory shell layers such as 2440, and 2450. The shell encapsulates the core by covering all surfaces of the core that are not in direct contact with substrate 2490, as illustrated by the cross-sectional view shown in FIG. 24. Thus, the core-shell structure comprises two or more layers in total, with a minimum of one core layer and a minimum of one refractory shell layer. In some embodiments, each core or shell layer may have a thickness greater than 1 nanometer; in some embodiments, each core or shell layer may have a thickness in a range between 1 nanometer and 100 nanometers inclusive. In addition, substrate 2490 comprises necessary epitaxy layers to form compound semiconductor devices, and have compositions similar to substrate 290 discussed with respect to FIG. 2.

In various embodiments, the core-shell structure as illustrated by FIG. 24 may be used to make both core-shell ohmic contacts and core-shell Schottky contacts. Each core or shell layer may be a metal belonging to Column III up to Column XI of the period table. For an ohmic contact, the core deposited on top of substrate 2490 may comprise materials such as Ti, Ta, Al, Al:Cu alloys, Al:Si alloys, or any combination of those; the core-encapsulating shell, on the other hand, may comprise refractory materials such as Mo, W, or TiN. In some embodiments, the lowest core layer 2410 is formed of a refractory material. A refractory material has a melting point above 1100° C. In addition, in some embodiments, an ohmic contact may be formed at the interface between lowest core layer 2410 and semiconductor substrate 2490 using an annealing process at a temperature above or equal to 500° C. For an Schottky contact, the core deposited on top of substrate 2490 may comprise a material with a work function higher than substrate 2490 underneath. For example, the core may comprise materials such as Ti, TiN, Ni, WN, W, and Mo for a AlGaN/GaN transistor. On the other hand, for a Schottky contact, the core-encapsulating shell may comprise a refractory material such as Mo, W, or TiN.

Furthermore, in an illustrative embodiment of a core-shell ohmic or Schottky contact with three layers, contact 2400 shown in FIG. 24 may consist two core layers 2410, 2430, and a shell layer 2440 only. A refractory material may be first deposited on substrate 2490, and a conventional low-resistivity material may then be deposited on top of the refractory layer. After using photolithography, dry-etching may be performed to make the core structure having a refractory core layer 2410 and a low-resistivity core layer 2430. Another refractory material may then be deposited on the core and selectively dry-etched to form refractory shell layer 2440 for fully encapsulating layers 2410 and 2440. In various embodiments, refractory core layer 2410 may be a metal such as Ti, Ta, W, Mo, a nitridation of these metals such as TiN, TaN, WN, MoN, or any combination of those. Lower-resistivity core layer 2430 may be made of materials such as Al, W, Mo, Ta, Cu, Al:Si, Al:Cu or any combination of those. Refractory shell layer 2440 may be made of a metal such as W, Mo, Pt, Ni, a nitridation of these metals such as TiN, TaN, WN, MoN, or a combination of those.

Figure 25:
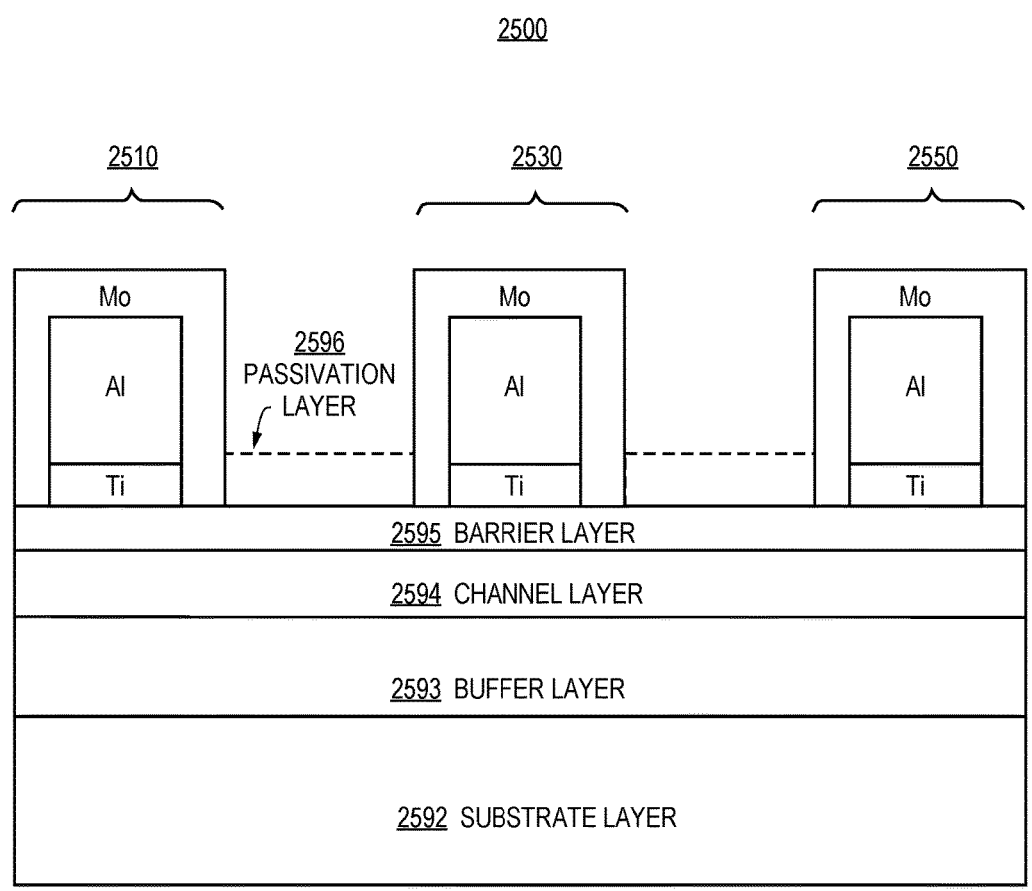
FIG. 25 shows an exemplary transistor having core-shell electrodes, according to one embodiment of the present invention.

FIG. 25 shows an exemplary transistor using core-shell electrodes, according to one embodiment of the present invention. In this example, planar core-shell ohmic and Schottky contacts are deposited as source electrode 2510, drain electrode 2550, and gate electrode 2530 of a III-N HEMT 2500. Transistor 2500 may be made by first epitaxially growing III-N semiconductor layers on a substrate layer 2592. Substrate layer 2592 may comprise Si, SiC, Sapphire, ZnO, or III-N semiconductor materials. A buffer layer 2593 may be deposited on substrate layer 2592, and a channel layer 2594 such as a GaN layer may be disposed on buffer layer 2593 for carrier conduction. A barrier layer 2595 such as an $Al_xGa_yN$ layer or an $In_xAl_yN$ layer may be grown on channel layer 2594, with a larger bandgap than channel layer 2594 for confinement of channel carriers near the heterojunction between barrier layer 2595 and channel layer 2594. In some embodiments, barrier layer 2595 may include more than one semiconductor sublayers. Moreover, in this example, gate electrode 2530 is formed on top of barrier layer 2595 in a gate region, while source electrode 2510 and drain electrode 2550 are formed on top of barrier layer 2595 in a source region and a drain region respectively. Each electrode is made with a core-shell structure having a refractory core layer made of Ti, a low-resistivity core layer made of Al, and a refractory shell layer made of Mo. In some embodiments, an optional passivation layer 2596 may also be included. The novel core-shell structure illustrated by FIG. 25 may be used in micro and opto-electronics devices.

Figure 26:
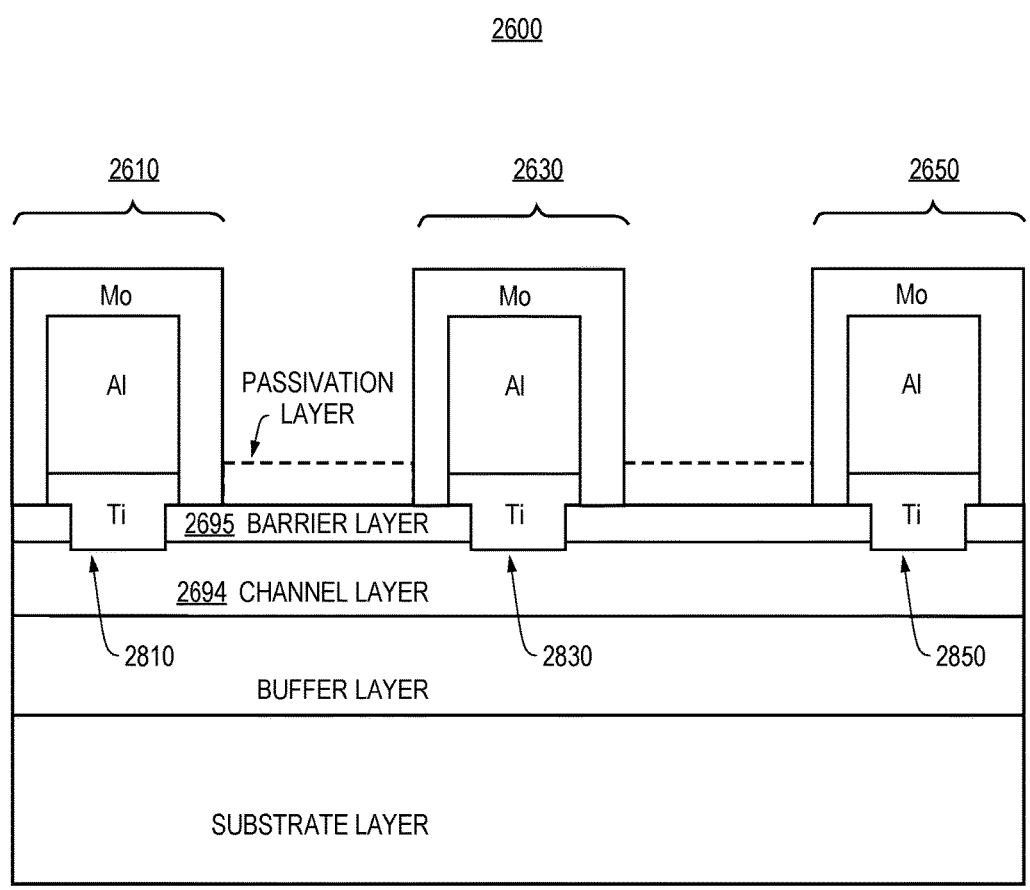
FIG. 26 shows an exemplary transistor having core-shell electrodes with substrate recesses, according to one embodiment of the present invention.

FIG. 26 shows an exemplary transistor 2600 using core-shell electrodes, according to another embodiment of the present invention. In this particular example, the core of source ohmic contact 2610, gate contact 2630, and drain ohmic contact 2650 are recessed or etched into the semiconductor below at recess regions 2810, 2830, and 2850 respectively, and the bottom surface of each electrode is within channel layer 2694. For each core-shell electrode, the core may recess into the semiconductor material underneath in any desirable depth, and more than one core layer may be recessed into the semiconductor material. In some embodiments, recess regions 2810, 2830 and 2850 may have the same or different lateral lengths, and/or the same or different depths. In some embodiments, each recess region may partially or fully overlap with the core above. In yet some embodiments, not all three electrodes are recessed into the semiconductor material.

Additional Aspects

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. For example, an apparatus, structure, device, layer, or region recited as "including," "comprising," or "having," "containing," "involving," a particular material is meant to encompass at least the material listed and any other elements or materials that may be present. The partially open-ended phrase "consisting essentially of" is meant to encompass essentially the material listed and does not preclude the presence of relatively small quantities of other materials, including the presence of dopants.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments. In other words, although the present invention has been described with reference to specific exemplary embodiments, it will be evident that the various modification and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention.

What is claimed is:

1. A semiconductor transistor device, comprising:
   a semiconductor substrate;
   a source ohmic contact, a drain ohmic contact, a gate contact disposed over a gate region positioned between the source ohmic contact and the drain ohmic contact, and a gate field plate connected to the gate contact and extending away from the gate contact;
   a first field-plate dielectric disposed over the semiconductor substrate;
   a second encapsulating dielectric disposed over the gate contact and the gate field plate, wherein the second encapsulating dielectric covers a top surface of the gate contact and a top surface of the gate field plate, and wherein the second encapsulating dielectric is not the first field-plate dielectric; and
   a source field plate connected to the source ohmic contact, wherein the source field plate is disposed over the first field-plate dielectric, wherein the second encapsulating dielectric is absent from at least a first region of the first field-plate dielectric over which the source field plate is disposed, and wherein a lower surface of the source field plate in the first region is flush with or above a lower surface of the gate field plate.

2. The semiconductor transistor device of claim 1, wherein the semiconductor substrate comprises a material selected from the group consisting of Group IV, Group III-V, and Group II-VI semiconductor materials.

3. The semiconductor transistor device of claim 1, wherein the semiconductor substrate comprises a Group III-Nitride (III-N) material.

4. The semiconductor transistor device of claim 1, wherein the source field plate is electrically connected to the source ohmic contact.

5. The semiconductor transistor device of claim 1, wherein the source field plate is capacitively coupled to the source ohmic contact.

6. The semiconductor transistor device of claim 1, wherein the field-plate dielectric comprises at least two layers.

7. The semiconductor transistor device of claim 6, wherein a thickness of a first layer of the field-plate dielectric and a thickness of a second layer of the field-plate dielectric are different.

8. The semiconductor transistor device of claim 6, wherein a thickness of a first layer of the field-plate dielectric and a thickness of a second layer of the field-plate dielectric are the same.

9. The semiconductor transistor device of claim 1, wherein the first region has a length longer than 1 nanometer.

10. The semiconductor transistor device of claim 1, wherein the second encapsulating dielectric exceeds the gate contact by a length between 1 and 10,000 nanometers over a region between the gate contact and the drain ohmic contact.

11. The semiconductor transistor device of claim 1, wherein the top surface of the gate contact is flush with or lower than a top surface of the field-plate dielectric.

12. The semiconductor transistor device of claim 1, wherein the gate region includes a recess.

13. The semiconductor transistor device of claim 1, further comprising a gate dielectric disposed below the gate contact.

14. The semiconductor transistor device of claim 1, wherein the first field-plate dielectric is made from one or more materials selected from the group consisting of silicon nitride, silicon oxide, aluminum oxide, aluminum nitride, silicon oxynitride, and hafnium oxide.

15. The semiconductor transistor device of claim 1,
   wherein the gate field plate is disposed over the first field-plate dielectric in a second region, and
   wherein the second region does not overlap with the first region.

16. The semiconductor transistor device of claim 1, wherein the gate field plate is stepped.

17. The semiconductor transistor device of claim 15, wherein the second region has a length longer than 1 nanometer.

18. The semiconductor transistor device of claim 15, wherein the second encapsulating dielectric exceeds the gate field plate by a length between 1 and 10,000 nanometers.

* * * * *